United States Patent
Yamashita

(10) Patent No.: US 9,379,149 B2
(45) Date of Patent: Jun. 28, 2016

(54) SOLID-STATE IMAGE PICKUP DEVICE AND METHOD OF DRIVING THE SAME

(71) Applicant: Sony Corporation, Tokyo (JP)

(72) Inventor: Kazuyoshi Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 295 days.

(21) Appl. No.: 14/079,103

(22) Filed: Nov. 13, 2013

(65) Prior Publication Data

US 2014/0151531 A1 Jun. 5, 2014

(30) Foreign Application Priority Data

Dec. 5, 2012 (JP) ................. 2012-266002

(51) Int. Cl.
*H01L 27/00* (2006.01)
*H01L 27/146* (2006.01)

(52) U.S. Cl.
CPC ...... *H01L 27/14607* (2013.01); *H01L 27/1464* (2013.01); *H01L 27/14612* (2013.01); *H01L 27/14614* (2013.01); *H01L 27/14623* (2013.01); *H01L 27/14641* (2013.01); *H01L 27/14645* (2013.01)

(58) Field of Classification Search
CPC ............. H01L 27/14609; H01L 27/1464; H01L 27/14612

USPC ........... 250/208.1, 214.1; 257/306, 435, 447, 257/448
See application file for complete search history.

(56) References Cited

U.S. PATENT DOCUMENTS

| 8,981,276 B2 * | 3/2015 | Yamakawa | H01L 27/14609 250/208.1 |
|---|---|---|---|
| 2010/0230579 A1 * | 9/2010 | Watanabe | H01L 27/14609 250/208.1 |

FOREIGN PATENT DOCUMENTS

JP 2007-516654 A 6/2007

\* cited by examiner

*Primary Examiner* — Kevin Pyo
(74) *Attorney, Agent, or Firm* — Chip Law Group

(57) ABSTRACT

Imaging sensors, imaging apparatuses, and methods of driving an image sensor are provided. An image sensor can include a semiconductor substrate with a photoelectric conversion element and a charge-conversion element. The sensor can further include a capacitance switch. A charge accumulation element is located adjacent the photoelectric conversion element. At least a portion of the charge accumulation element overlaps a charge accumulation region of the photoelectric conversion element. The charge accumulation element is selectively connected to the charge-voltage conversion element by the capacitance switch.

23 Claims, 19 Drawing Sheets

SOLID-STATE IMAGE PICKUP DEVICE AND METHOD OF DRIVING THE SAME

BACKGROUND

The present technology relates to a solid-state image pickup device and to a method of driving the same. In particular, the present technology relates to a solid-state image pickup device and a method of driving a solid-state image pickup device that are capable of improving image quality.

There has been known a solid-state image pickup device that allows capacitance in a floating diffusion (FD) region provided in a pixel to be variable, and thereby adjusting efficiency of conversion, to a voltage, from an electric charge obtained by receiving light from a subject (for example, see Japanese Unexamined Patent Application Publication (Translation of PCT Application) No. 2007-516654).

In such a solid-state image pickup device, when a signal amount is small, that is, under a low-illuminance condition, sensitivity of the pixel is increased through reducing capacitance of the FD region, and thereby, conversion efficiency is increased. In contrast, when the signal amount is large, that is, under a high-luminance condition, the sensitivity of the pixel is decreased through increasing the capacitance of the FD region, and thereby, the conversion efficiency is decreased. Thus, dynamic range is increased.

In the solid-state image pickup device in which the capacitance of the FD region is variable, a capacitive element is provided between pixels, that is, on the same plane as that of the FD region and a photoelectric conversion element of the pixel, photoelectric conversion element and the like. The capacitive element is connected to the FD region via a switch for allowing the capacitance to be varied. Through turning on or off the switch, switching between a state in which capacitance is added to that of the FD region and a state in which capacitance is not added to that of the FD region is performed. Thus, conversion efficiency is adjusted.

SUMMARY

In order to increase the dynamic range of a pixel, it is desirable to increase a difference between high level and low level of conversion efficiency in the pixel. In order to increase the difference, it is necessary to increase capacitance of the capacitive element that is to be added to the capacitance of the FD region.

However, in the above-described technology, it is necessary to provide the capacitive element for adding capacitance to that of the FD region between pixels that are adjacent to each other. Therefore, in order to secure an area of the capacitive element, it is necessary to reduce the size of elements such as a photodiode and a pixel transistor in the pixel.

Accordingly, for example, since an area of the photodiode is reduced, a photoelectric conversion region of the solid-state image pickup device becomes small. Therefore, the light receiving sensitivity of the pixel is decreased. Accordingly, not only the S/N ratio (signal-to-noise ratio) but also the saturated signal amount of the photodiode is decreased. As a result, the image quality of the image obtained by the solid-state image pickup device is degraded. It is to be noted that, in general, it is known that the area of the photodiode is proportional to the saturated signal amount.

Moreover, in order to secure a large area of the capacitive element for adding capacitance to that of the FD region, it is necessary to reduce the size of the transistors arranged in the pixel as well. For example, when a size of an amplifier transistor that is used to read a voltage, that is, a signal level, obtained by receiving light from a subject is reduced, random noise is increased, which leads to a degradation in image quality.

Moreover, for example, when the size of a transistor such as a selection transistor, a reset transistor, and a transfer transistor in the pixel is reduced, variations in transistor characteristics are increased. Therefore, noise is increased and S/N ratio is decreased. Accordingly, image quality is degraded.

It is desirable to provide a solid-state image pickup device and a method of driving the same that are capable of improving image quality.

According to an embodiment of the present disclosure, there is provided an image sensor. The image sensor includes a semiconductor substrate having a photoelectric conversion element and a charge-voltage conversion element. The sensor further includes a capacitance switch. A charge accumulation element is located adjacent the photoelectric conversion element. At least a portion of the charge accumulation element overlaps a charge accumulation region of the photoelectric conversion element. The charge accumulation element is selectively connected to the charge-voltage conversion element by the capacitance switch.

In accordance with further embodiments, a capacitance of the charge accumulation element is added to a capacitance of the charge-voltage conversion element when the capacitance switch is closed. Alternatively or in addition, the photoelectric conversion element can be provided between the charge accumulation element and a light receiving surface of the semiconductor substrate. The image sensor can further comprise a back illumination type image sensor in which the photoelectric conversion element is provided between a light receiving surface of the semiconductor substrate and a wiring layer. Moreover, the charge accumulation element can be part of the wiring layer.

In accordance with further embodiments, the image sensor can include a light shielding layer. The charge accumulation element can be formed as part of the light shielding layer. Moreover, the charge accumulation element can be formed between the light shielding layer and the photoelectric conversion element.

In accordance with still other embodiments, a plurality of photoelectric conversion elements and a plurality of charge-voltage conversion elements can share a single one of the charge accumulation elements. The charge accumulation element can include first and second electrodes, wherein a first one of the electrodes is connected to the capacitance switch. The charge-voltage conversion element can be a floating diffusion region, and the charge accumulation element can be a capacitor. In accordance with still other embodiments, the image sensor can be a front illumination type image sensor, wherein the charge-voltage conversion element is included in an image plane phase difference pixel, and wherein the charge accumulation element operates as a light shielding layer with respect to the charge-voltage conversion element.

In accordance with further embodiments of the present disclosure, an imaging apparatus is provided. The apparatus includes an optical section and a solid-state image pickup device operable to receive light from the optical section. The solid-state image pickup device includes a photoelectric conversion element, and a charge-voltage conversion element. The solid-state image pickup device can further include a capacitance switch, and a charge accumulation element adjacent the photoelectric conversion element. At least a portion of the charge accumulation element overlaps a charge accumulation region of the photoelectric conversion element. The charge accumulation element can be selectively connected to the charge-voltage conversion element by the capacitance switch. In addition, a digital signal processor can be included as part of the apparatus, wherein the digital signal processor receives a signal from the solid-state image pickup device.

In accordance with still other embodiments, the photoelectric conversion element of the apparatus is provided between the charge accumulation element and a light receiving surface of a semiconductor substrate in which the photoelectric conversion elements are formed. The apparatus can further include a wiring layer wherein the image sensor is a back illumination type image sensor in which the photoelectric conversion element is provided between the light receiving surface of the semiconductor substrate and the wiring layer. In addition, the charge accumulation element can be part of the wiring layer.

In accordance with still other embodiments, the apparatus can include a light shielding layer. Moreover, the charge accumulation element can be formed between the light shielding layer and the photoelectric conversion element.

In accordance with still other embodiments, a method of driving an image sensor is provided. More particularly, a solid-state image sensor including a photoelectric conversion element, a charge-voltage conversion element, and a charge accumulation element are provided as part of a solid-state image sensor. At least a portion of the charge accumulation element overlaps a charge accumulation region of the photoelectric conversion element. The capacitance of the charge accumulation element is capable of being added to a capacitance of the charge-voltage conversion element. According to the method, an illuminance condition is detected. In response to determining that the illuminance condition is low, the charge-voltage conversion element is electrically disconnected from the charge accumulation element. In response to determining that the illuminance condition is high, the charge-voltage conversion element is electrically connected to the charge accumulation element.

A capacitance switch can be provided to selectively connect the charge accumulation element to the charge-voltage conversion element. More particularly, the capacitance switch is opened to electrically disconnect the charge-voltage conversion element from the charge accumulation element. The capacitance switch is closed to electrically connect the charge-voltage conversion element to the charge accumulation element.

According to further embodiments of the method, the solid-state image sensor can be a back illumination type image sensor.

Alternatively, the solid-state image sensor can be a front illumination type sensor that includes an image plane phase difference pixel that can be used for image plane phase difference autofocus, wherein the charge accumulation element operates as a light shielding layer of the image plane phase difference pixel.

Additional features and advantages of embodiments of the present disclosure will become more readily apparent from the following description, particularly when taken together with the accompanying drawings.

According to the above-described embodiments of the present technology, image quality is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments of the present technology will be described below with reference to the drawings.

First Embodiment

[Configuration Example of Solid-State Image Pickup Device]

Figure 1:
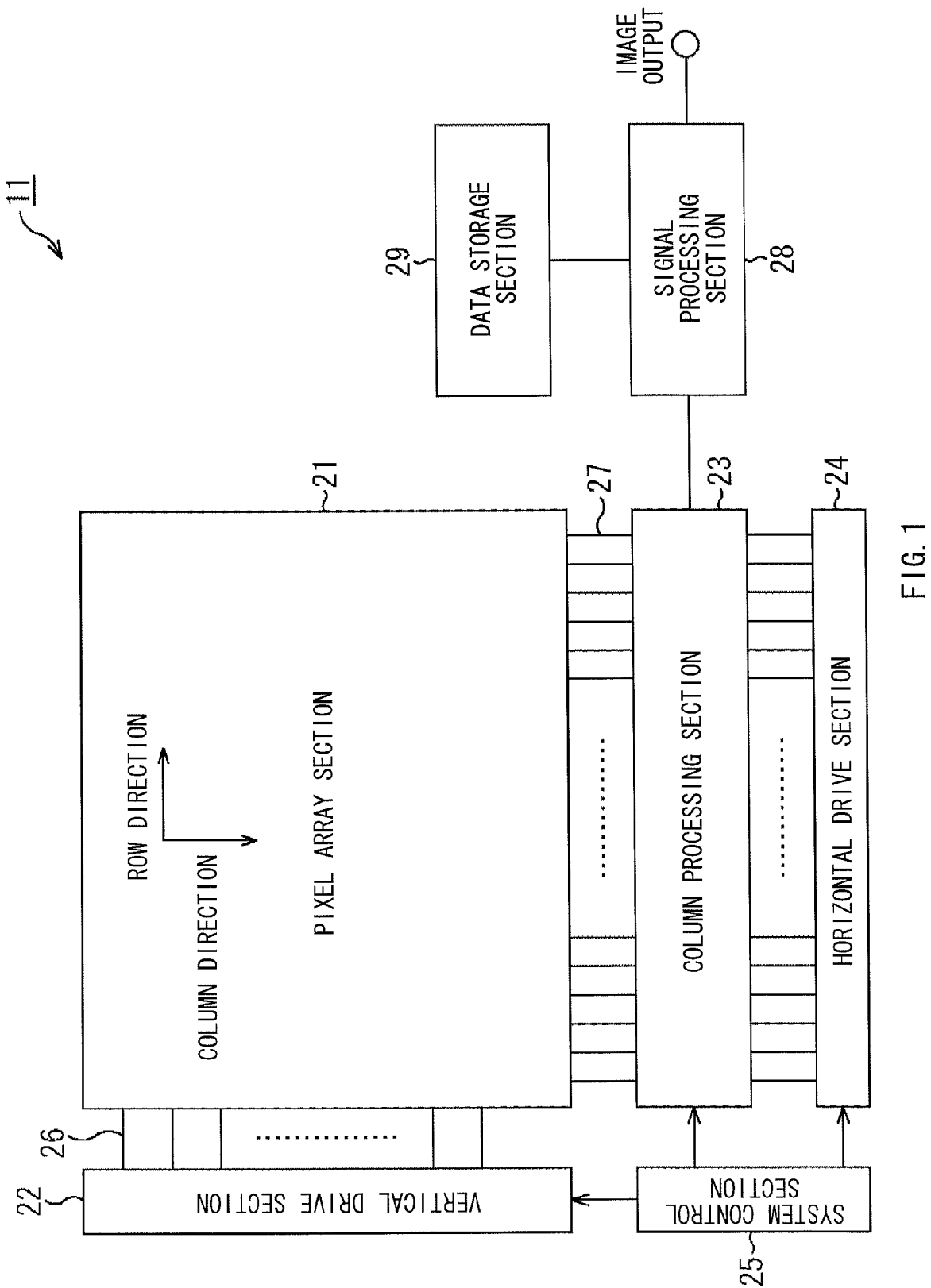
FIG. 1 is a diagram illustrating a configuration example of a solid-state image pickup device.

First, description will be given of a configuration example of a solid-state image pickup device to which an embodiment of the present technology is applied. FIG. 1 is a diagram illustrating the configuration example of the solid-state image pickup device to which the present embodiment of the present technology is applied.

A solid-state image pickup device 11 may be, for example, an image sensor of a back illumination type that may be configured of, for example, a CMOS (Complementary Metal Oxide Semiconductor) image sensor or the like. The solid-state image pickup device 11 receives light from a subject and performs photoelectric conversion on the received light to generate an image signal, thereby picking up an image.

It is to be noted that an image sensor of a back illumination type has a configuration in which a photodiode is provided between a light receiving surface and a wiring layer. The light receiving surface is a surface on which the light from the subject is incident, and can include an on-chip lens that collects light. The wiring layer may include wirings, for example, of a transistor that drives each pixel, etc.

The solid-state image pickup device 11 includes a pixel array section 21, a vertical drive section 22, a column processing section 23, a horizontal drive section 24, a system control section 25, pixel drive lines 26, vertical signal lines 27, a signal processing section 28, and a data storage section 29.

In the solid-state image pickup device 11, the pixel array section 21 is formed on a semiconductor substrate (chip) which is not illustrated. Further, the vertical drive section 22, the column processing section 23, the horizontal drive section 24, and the system control section 25 are integrated on the semiconductor substrate.

The pixel array section 21 includes pixels that each include a photoelectric conversion element that generates electric charge according to an amount of light incident from a subject and accumulates the generated electric charge. The pixels included in the pixel array section 21 are arranged two-dimensionally in a horizontal direction (row direction) and in a vertical direction (column direction) in the drawing.

For example, in the pixel array section 21, the pixel drive lines 26 are wired along the row direction for each pixel row that includes pixels arranged in the row direction. Also, the vertical signal lines 27 are wired along the column direction for each pixel column that includes pixels arranged in the column direction.

The vertical drive section 22 may be configured, for example, of a shift register, an address decoder, and/or the like. The vertical drive section 22 supplies signals etc. to the respective pixels via the plurality of pixel drive lines 26, thereby driving all of the respective pixels in the pixel array section 21 at the same time, or driving each row etc. of the respective pixels in the pixel array section 21.

The column processing section 23 reads signals from the respective pixels via the vertical signal lines 27 for each pixel column in the pixel array section 21. The column processing section 23 performs, on the read signals, processing such as denoising processing, correlated double sampling processing, and A-D (Analog-to-Digital) conversion processing, thereby generating pixel signals.

The horizontal drive section 24 may be configured, for example, of a shift register, an address decoder, and/or the like. The horizontal drive section 24 sequentially selects unit circuits corresponding to the pixel columns in the column processing section 23. Through the selective scanning by the horizontal drive section 24, the pixel signals, on which the signal processing is performed for each unit circuit in the column processing section 23, are sequentially outputted to the signal processing section 28.

The system control section 25 may be configured, for example, of a timing generator that generates various timing signals, etc. The system control section 25 controls drive of the vertical drive section 22, the column processing section 23, and the horizontal drive section 24, based on the timing signals generated by the timing generator.

The signal processing section 28 performs, on the pixel signals supplied from the column processing section 23, signal processing such as arithmetic processing and outputs the image signals configured of the respective pixel signals, while temporally storing data in the data storage section 29 as necessary.

[Configuration Example of Pixel]

Figure 2:
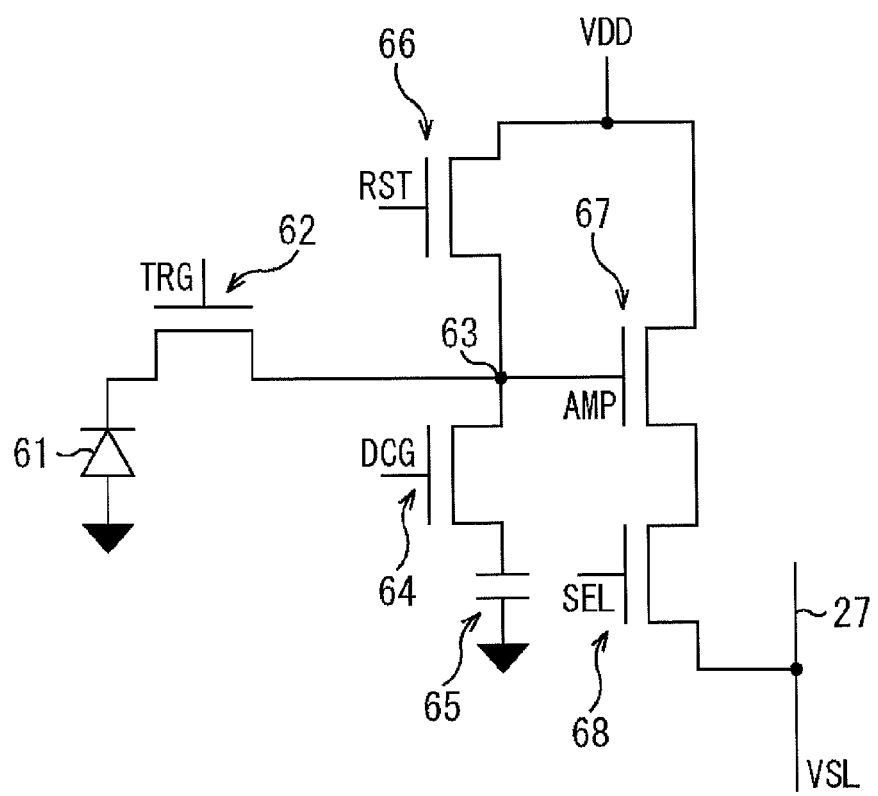
FIG. 2 is a diagram illustrating a configuration example of a pixel.

Next, description will be given of a configuration of each pixel in the above-described pixel array section 21. FIG. 2 is a circuit diagram illustrating a configuration example of one pixel provided in the pixel array section 21.

In FIG. 2, the pixel in the pixel array section 21 includes a photodiode 61, a transfer gate element 62, a charge-voltage conversion element 63, a capacitance switch 64, a charge accumulation element 65, a reset gate element 66, an amplifier transistor 67, and a selection transistor 68.

The photodiode 61 may be, for example, a photoelectric conversion element that is configured of a PN-junction photodiode. The photodiode 61 receives light from a subject, generates electric charge according to an amount of the received light through photoelectric conversion, and accumulates the generated electric charge.

The transfer gate element 62 is provided between the photodiode 61 and the charge-voltage conversion element 63. The transfer gate element 62 transfers the electric charge accumulated in the photodiode 61 to the charge-voltage conversion element 63 in response to a drive signal TRG that is applied to a gate electrode of the transfer gate element 62.

For example, in FIG. 2, the transfer gate element 62, the capacitance switch 64, the reset gate element 66, and the selection transistor 68 may be each comprise an N-channel MOS transistor.

Driving signals TRG, DCG, RST, and SEL are supplied to gate electrodes of the transfer gate element 62, the capacitance switch 64, the reset gate element 66, and the selection transistor 68, respectively. These drive signals TRG, DCG, RST, and SEL are each a pulse signal that is activated (ON) in a high level state and is inactivated (OFF) in a low level state.

Accordingly, to give an example referring to the transfer gate element 62, when the drive signal TRG supplied to the gate electrode of the transfer gate element 62 is activated and the transfer gate element 62 is allowed to be ON, the electric charge accumulated in the photodiode 61 is transferred to the charge-voltage conversion element 63.

The charge-voltage conversion element 63 is a floating diffusion (FD) region that converts, into an electric signal, the electric charge that has been transferred from the photodiode 61 via the transfer gate element 62, and outputs the electric signal. The electric signal may be, for example, a voltage signal.

The charge-voltage conversion element 63 is connected to the reset gate element 66, and is also connected to the vertical signal line 27 via the amplifier transistor 67 and the selection transistor 68. Further, the charge-voltage conversion element 63 is connected, via the capacitance switch 64, to the charge accumulation element 65 that is a capacitor that accumulates electric charge.

The capacitance switch 64 is turned on or off in response to the drive signal DCG, thereby switching a connection state of the charge-voltage conversion element 63 and the charge accumulation element 65 between an electrically-connected state and an electrically-disconnected state.

Specifically, the drive signal DCG is supplied to the gate electrode configuring the capacitance switch 64. When the drive signal DCG is ON, potential just below the capacitance switch 64 becomes deep, which allows the charge-voltage conversion element 63 to be electrically connected to the charge accumulation element 65.

On the other hand, when the drive signal DCG is OFF, the potential just below the capacitance switch 64 becomes shallow, which allows the charge-voltage conversion element 63 to be electrically disconnected from the charge accumulation element 65.

Accordingly, through allowing the drive signal DCG to be ON or OFF, capacitance is added to that of the charge-voltage conversion element 63 and sensitivity of the pixel is varied. Specifically, a relationship represented by $\Delta V = \Delta Q/C$ is established where $\Delta Q$ is an amount of variation in the accumulated electric charge, $\Delta V$ is variation in a voltage at that time, and C is a capacitance value.

The capacitance value C in a region in the pixel in which a signal level is read is represented by $C_{FD} + C_{CAP}$ in a state where the drive signal DCG is ON, where a capacitance value of the charge-voltage conversion element 63 is $C_{FD}$, and a capacitance value of the charge accumulation element 65 is $C_{CAP}$. On the other hand, when the drive signal DCG is OFF, the capacitance value C is varied to $C_{FD}$, and therefore, sensitivity of a voltage (an amount of variation in voltage) with respect to the amount of variation in electric charge is increased.

As described above, in the solid-state image pickup device 11, the sensitivity of the pixel is appropriately varied through allowing the drive signal DCG to be ON or OFF. For example, when the drive signal DCG is allowed to be ON, the charge accumulation element 65 is electrically connected to the charge-voltage conversion element 63. Therefore, part of the electric charge that has been transferred from the photodiode 61 to the charge-voltage conversion element 63 is accumulated not only in the charge-voltage conversion element 63 but also in the charge accumulation element 65.

It is to be noted that, more in detail, the charge-voltage conversion element 63 is also connected as necessary to the charge accumulation element provided in the adjacent pixel in addition to the charge accumulation element 65. Further, the charge accumulation element 65 is adjacent to an opposite surface of the photodiode 61 from the light receiving surface thereof, that is, to a region on which the light from the subject is not incident. Also, the charge accumulation element 65 is so provided to overlap the photodiode 61. Therefore, the light from the subject is prevented from being shielded by the charge accumulation element 65. Accordingly, the amount of light incident on the photodiode 61 is prevented from being decreased.

The reset gate element 66 is an element that initializes (resets) each region in the charge-voltage conversion element 63, the capacitance switch 64, and the charge accumulation element 65 as necessary. A drain of the reset gate element 66 is connected to a power source having a power source voltage VDD, and a source thereof is connected to the charge-voltage conversion element 63. The gate electrode of the reset gate element 66 is supplied with the drive signal RST as a reset signal.

When the drive signal RST is activated, the reset gate element 66 becomes conductive, and a potential at each of the charge-voltage conversion element 63 etc. is reset to a level of the power source voltage VDD. In other words, the charge-voltage conversion element 63 etc. are initialized.

A gate electrode of the amplifier transistor 67 is connected to the charge-voltage conversion element 63, and a drain thereof is connected to the power source having the power source voltage VDD. The amplifier transistor 67 serves as an input section of a source follower circuit that reads the electric charge obtained through the photoelectric conversion by the photodiode 61. In other words, since the source of the amplifier transistor 67 is connected to the vertical signal line 27 via the selection transistor 68, the amplifier transistor 67 configures the source follower circuit, together with a constant current source connected to an end of the vertical signal line 27.

The selection transistor 68 is connected between the source of the amplifier transistor 67 and the vertical signal line 27. The gate electrode of the selection transistor 68 is supplied with the drive signal SEL as a selection signal. When the drive signal SEL is activated, the selection transistor 68 becomes conductive, and the pixel provided with the selection transistor 68 is selected. When the pixel is selected, the signal outputted from the amplifier transistor 67 is read by the column processing section 23 via the vertical signal line 27.

In each pixel, as the pixel drive lines 26 shown in FIG. 1, a plurality of drive lines may be wired, for example, for each pixel row. Further, the vertical drive section 22 supplies the drive signals TRG, DCG, RST, and SEL to the pixel via the plurality of drive lines that serve as the pixel drive lines 26.

[Layout of Charge Accumulation Element]

Subsequently, description will be given of an arrangement example of the charge accumulation element 65 provided in the pixel.

Figure 3:
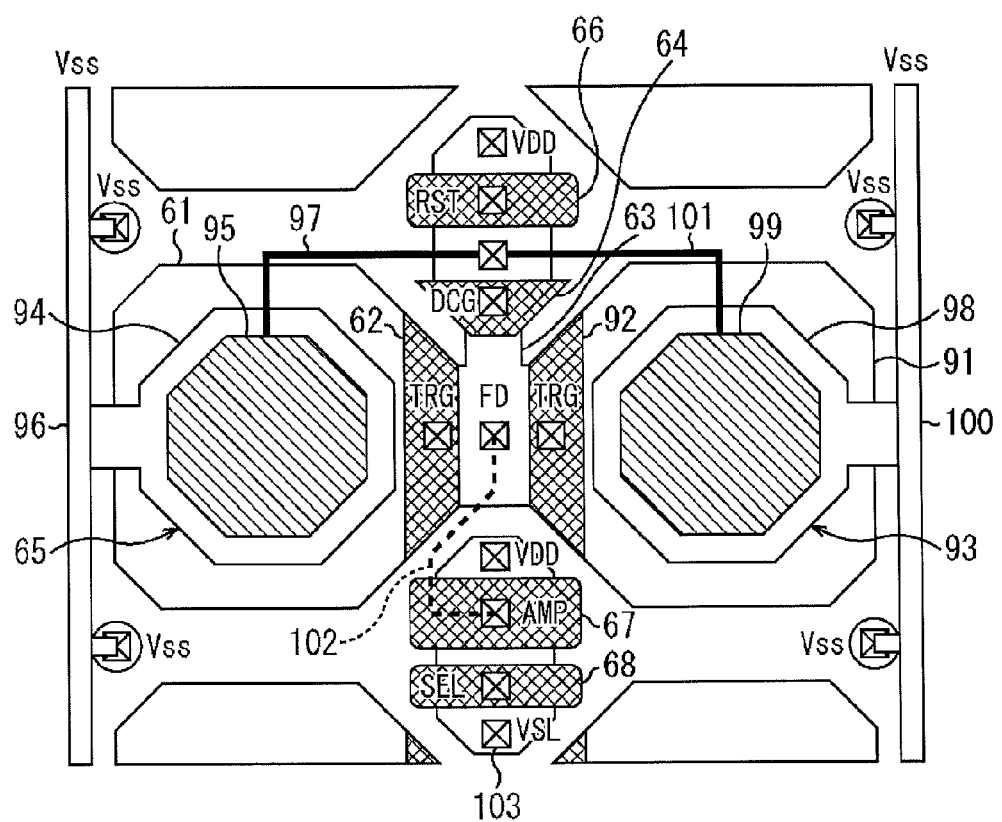
FIG. 3 is a diagram illustrating an arrangement example of a charge accumulation element.

The charge accumulation element 65 may be, for example, so provided to overlap the opposite surface of the photodiode 61 from the light receiving surface thereof, as shown in FIG. 3. It is to be noted that, in FIG. 3, the same numerals are used to designate corresponding components in FIG. 2, and the description thereof will be appropriately omitted. Also, in the drawing, a square with a symbol "x" represents a contact connected to the gate electrode of the transistor etc.

In the example shown in FIG. 3, another pixel that includes a photodiode 91, a transfer gate element 92, and a charge accumulation element 93 is so provided to be adjacent to the pixel that includes the photodiode 61. These two pixels share the charge-voltage conversion element 63, the capacitance switch 64, the reset gate element 66, the amplifier transistor 67, and the selection transistor 68. Further, the two pixels share the charge accumulation element 65 and the charge accumulation element 93 that are provided in the respective pixels as well.

In this example, the surface shown in the drawing is on the wiring layer side that is opposite from the light receiving surface of the photodiode 61, the photodiode 91, and the like.

The charge accumulation element 65 includes two electrodes, that is, an electrode 94 and an electrode 95 that face each other. The electrodes 94 and 95 each may be formed, for example, of metal such as aluminum, copper, gold, and silver.

The electrode 94 is so provided to be adjacent to a surface on the wiring layer side of the photodiode 61. The electrode 94 is connected to a wire 96 to which a voltage Vss is applied. For example, the voltage Vss may be at a ground level (GND) or the like. It is to be noted that, when a connection part of the wire 96 provided on the substrate is isolated from other elements, for example, by being covered with a P-type semiconductor region, the voltage Vss to be applied to the wire 96 may be, for example, the power source voltage VDD or the like.

Moreover, the electrode 95 that faces the electrode 94 is connected to the capacitance switch 64 by the capacitor wire 97.

As with the charge accumulation element 65, the charge accumulation element 93 includes electrodes 98 and 99 formed of metal. The electrode 98 provided on the photodiode 91 is connected to a wire 100 to which the voltage Vss is applied. The electrode 99 is connected to the capacitance switch 64 by a capacitor wire 101.

Accordingly, for example, when the drive signal DCG for the capacitance switch 64 is allowed to be ON, the charge-voltage conversion element 63 is electrically connected to the charge accumulation elements 65 and 93. Therefore, for example, upon reading of a pixel value of the pixel that includes the photodiode 61, when the transfer gate element 62 is allowed to be ON while the transfer gate element 92 is OFF, the electric charge in the photodiode 61 is accumulated in the charge-voltage conversion element 63, the charge accumulation element 65, and the charge accumulation element 93.

Accordingly, a voltage according to the electric charge accumulated in the charge-voltage conversion element 63 and the like is applied to the gate electrode of the amplifier transistor 67 via an FD wire 102. According to the applied voltage, a voltage that is outputted to the vertical signal line 27 which is connected to a contact 103 via the amplifier transistor 67 and the selection transistor 68 is varied. Therefore, the variation in the voltage is read by the column processing section 23 as the pixel signal.

On the other hand, for example, upon reading the pixel value of the pixel that includes the photodiode 91, the transfer gate element 62 is remained to be OFF, and the transfer gate element 92 is allowed to be ON. Accordingly, the electric charge in the photodiode 91 is accumulated in the charge-voltage conversion element 63, the charge accumulation element 65, and the charge accumulation element 93. A voltage according to the accumulated electric charge is applied to the gate electrode of the amplifier transistor 67 via the FD wire 102. Further, a voltage value according to the voltage applied to the gate electrode of the amplifier transistor 67 is read by the column processing section 23 via the selection transistor 68 and the vertical signal line 27.

Through allowing the electric charge to be accumulated not only in the charge accumulation element 65 provided in the pixel but also in the charge accumulation element 93 provided in the adjacent pixel as described above, capacitance to be added to that of the charge-voltage conversion element 63 is increased. Accordingly, the dynamic range of the pixel value under the high-illuminance condition is further increased.

The example in which the charge accumulation elements in the respective adjacent pixels are shared by the adjacent pixels is described above. However, it is to be noted that the charge accumulation element may not be shared. In such a case, for example, only the charge accumulation element 65 is electrically connected to the charge-voltage conversion element 63 in the pixel that includes the photodiode 61 to add capacitance to that of the charge-voltage conversion element 63.

Figure 4:
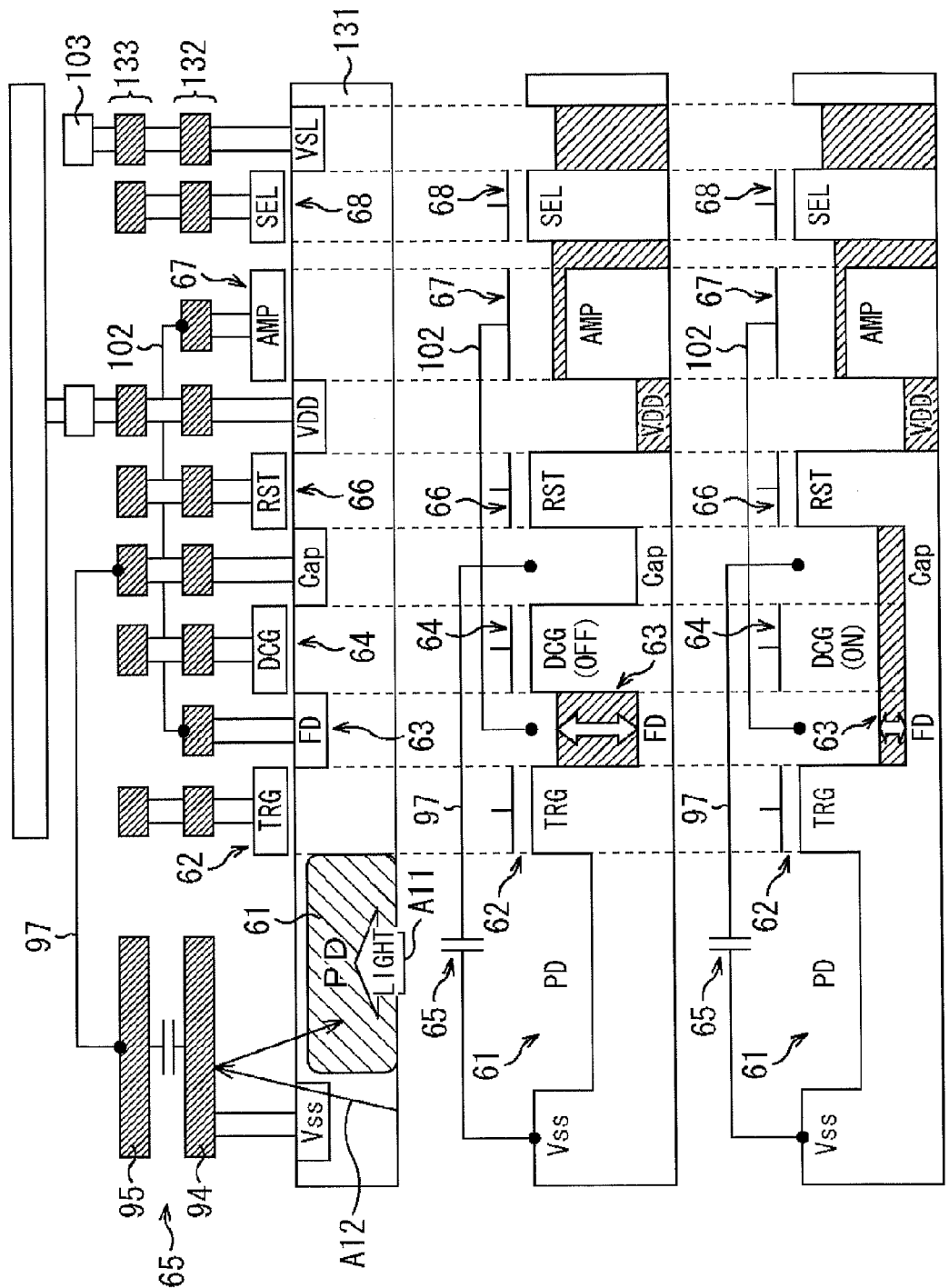
FIG. 4 is a diagram illustrating a cross-section of the pixel.

When the arrangement shown in FIG. 3 is adopted, a cross-section of the pixel that includes the photodiode 61 may be, for example, as shown in an upper part of FIG. 4. It is to be noted that the same numerals are used to designate corresponding components in FIG. 3, and the description thereof will be appropriately omitted.

In the upper part of FIG. 4, the photodiode 61 is provided in a P-type semiconductor region 131 provided on the substrate. A hatched region of the photodiode 61 indicates a charge accumulation region in which the electric charge obtained through the photoelectric conversion by the photodiode 61 is accumulated. Further, the electrode 94 of the charge accumulation element 65 is provided in a first metal layer 132 that is adjacent to the P-type semiconductor region 131. Further, the electrode 95 of the charge accumulation element 65 is provided in a second metal layer 133 that is adjacent to the first metal layer 132.

The electrode 94 that configures the charge accumulation element 65 is connected to the wire 96 to which the voltage Vss is applied. The electrode 95 is connected to the charge-voltage conversion element 63 by the capacitor wire 97 via the capacitance switch 64.

Moreover, in FIG. 4, light from a subject is incident on the photodiode 61 from a direction indicated by an arrow A11, that is, from the opposite side from the wiring layer that includes the first metal layer 132 and the second metal layer 133. Therefore, the light from the subject that travels toward the photodiode 61 is prevented from being shielded by the charge accumulation element 65 provided on the wiring layer side.

Moreover, in this example, the electrode 94 that is adjacent to the photodiode 61 is formed of metal. Therefore, as shown by an arrow A12, part of light that passes through the vicinity of the photodiode 61 is reflected by the electrode 94 and is incident on the photodiode 61. Therefore, the electrode 94 allows a larger amount of light to be led to the photodiode 61. In other words, efficiency of collecting the light from the subject is improved.

In the solid-state image pickup device 11 of a back illumination type, the charge accumulation element 65 does not overlap a surface on which light is incident in the charge accumulation region of the photodiode 61. Specifically, the charge accumulation element 65 is arranged so that part or all of the charge accumulation element 65 overlaps the charge accumulation region of the photodiode 61 when viewed from a side opposite from a side, of the photodiode 61, on which the light from the subject is incident. In other words, the charge accumulation element 65 is not provided in the P-type semiconductor region 131 provided with the photodiode 61 and the like, not in a region in which part of the transistors such as the amplifier transistor 67 is arranged, but in a portion, of the photodiode 61, on which light is not incident.

An area of the charge accumulation element 65 and areas of the photo diodes 61, the amplifier transistor 67, and the like have been in a relation of trade-off. However, in the solid-state image pickup device 11, a region in which the respective elements such as the photodiode 61 are provided is sufficiently secured regardless of the area of the charge accumulation element 65. In other words, it is not necessary to reduce size of the respective elements.

Accordingly, for example, the area of the photodiode 61 (the area of the photoelectric conversion region) is allowed to be further increased. Therefore, light receiving sensitivity of the pixel and saturated signal amount are improved. As a result, the S/N ratio of the signal read from the pixel is improved while sufficiently securing the area of the charge accumulation element 65. Therefore, image having better image quality is obtained.

Similarly, the area of the amplifier transistor 67 is allowed to be further increased regardless of the area of the charge accumulation element 65. Therefore, increase in random noise is suppressed and image quality is improved. Further, the area of the transfer gate element 62, the reset gate element 66, and the respective transistors such as the selection transistor 68 are allowed to be further increased. Therefore, variations in transistor characteristics are suppressed. Accordingly, degradation in S/N ratio is suppressed and an image having better image quality is obtained.

Subsequently, description will be given of switching of conversion efficiency (capacitance) performed through controlling ON and OFF of the capacitance switch 64. It is to be noted that, in a middle part and a lower part of FIG. 4, a lateral direction indicates a spatial direction in the solid-state image pickup device 11, and a vertical direction indicates potential.

First, when a signal amount is small, that is, under the low-illuminance condition, as shown in the middle part of the drawing, the capacitance switch 64 is allowed to be OFF, and the charge-voltage conversion element 63 is remained electrically disconnected from the charge accumulation elements 65 and 93. Therefore, capacitance of the charge-voltage conversion element 63 is allowed to be small. In other words, efficiency of conversion of the accumulated electric charge into voltage is increased. In this case, the signal outputted from the pixel is increased.

In this example, the charge-voltage conversion element 63 is electrically disconnected from the charge accumulation element 65 and from the charge accumulation element 93 (which is not illustrated in the drawing). Therefore, the electric charge obtained by the photodiode 61 is accumulated only in the charge-voltage conversion element 63. It is to be noted that the hatched region in the middle and lower parts of FIG. 4 indicates a region in which electric charge is accumulated.

In contrast, when the signal amount is large, that is, under the high-illuminance condition, as shown in the lower part of the drawing, the capacitance switch 64 is turned on, and the charge-voltage conversion element 63 is electrically connected to the charge accumulation elements 65 and 93. Therefore, the capacitance of the charge-voltage conversion element 63 is increased. In other words, efficiency of conversion of the accumulated electric charge into voltage is decreased.

In this example, when a high-level voltage is applied to the gate electrode of the capacitance switch 64 and the capacitance switch 64 is turned on, the potential just below the gate electrode is lowered (is allowed to be deeper). Therefore, the potential of the charge-voltage conversion element 63 is combined with the potential of the charge accumulation elements 65 and 93. In other words, the charge-voltage conversion element 63 is electrically connected to the charge accumulation elements 65 and 93.

Accordingly, the electric charge obtained by the photodiode 61 is accumulated in the charge-voltage conversion element 63, the charge accumulation element 65, and the charge accumulation element 93. In this case, capacitance of the charge accumulation elements 65 and 93 is added to that of the charge-voltage conversion element 63. As a result, the capacitance of the charge-voltage conversion element 63 is substantially increased, and therefore, conversion efficiency is decreased. Therefore, the dynamic range of the pixel value of the pixel is increased.

Figure 5:
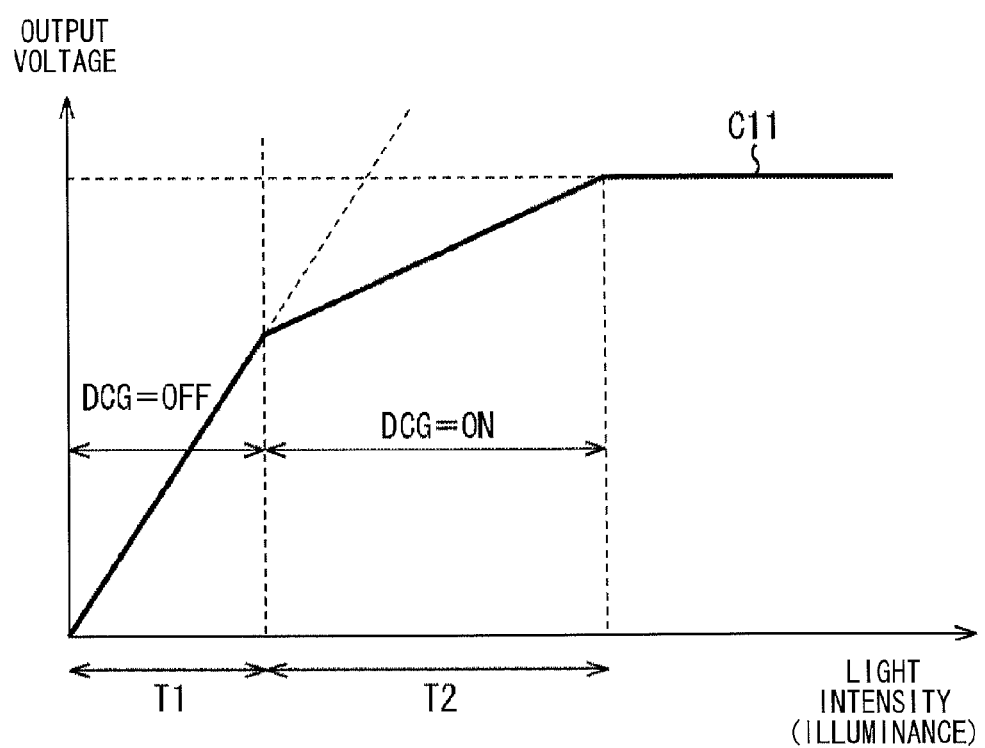
FIG. 5 is a diagram for explaining switching of conversion efficiency.

When the capacitance of the charge-voltage conversion element 63 is varied through turning on or off the capacitance switch 64 in such a manner, the conversion efficiency is varied as shown in a line graph C11 in FIG. 5. It is to be noted that, in FIG. 5, the vertical axis indicates an output voltage, that is, a value of voltage read from the vertical signal line 27. The horizontal axis indicates intensity of light that is incident on the photodiode 61.

For example, in a section T1 under a low-illuminance condition in which light intensity is weak, the capacitance switch 64 is OFF, and therefore, the conversion efficiency is high. In other words, a slope of the line graph C11 is large. On the other hand, in a section T2 under a high-illuminance condition in which light intensity is strong, the capacitance switch 64 is ON, and therefore, the conversion efficiency is low. In other words, the slope of the line graph C11 is small.

It is to be noted that switching between ON and OFF of the capacitance switch 64 may be performed in response to an instruction from a user, or may be performed by the solid-state image pickup device 11 depending on intensity of light incident on the photodiode 61.

[Description of Image Pickup Processing]

Further, description will be given of image pickup processing that is performed when an image of a subject is picked up by the solid-state image pickup device 11.

First, image pickup processing under the low-illuminance condition will be described referring to a flow chart shown in FIG. 6. It is to be noted that this image pickup processing may be performed on the respective pixels at the same timing or at different timings. Further, at the beginning of the image pickup processing, the transfer gate element 62, the transfer gate element 92, the capacitance switch 64, the reset gate element 66, and the selection transistor 68 are OFF.

In step S11, the vertical drive section 22 turns on the selection transistor 68 and allows a pixel to be selected.

In step S12, the vertical drive section 22 turns on the capacitance switch 64 and allows the charge-voltage conversion element 63 to be electrically connected to the charge accumulation elements 65 and 93.

In step S13, the vertical drive section 22 turns on the reset gate element 66 and allows the charge-voltage conversion element 63 and the charge accumulation elements 65 and 93 to be initialized (reset). In other words, the potentials at the charge-voltage conversion element 63 and at the charge accumulation elements 65 and 93 are reset to a level of the power source voltage VDD.

In step S14, the vertical drive section 22 turns off the capacitance switch 64 and the reset gate element 66. Thus, initialization of the charge-voltage conversion element 63 and the charge accumulation elements 65 and 93 is completed.

In step S15, the column processing section 23 reads a voltage value, as a reset level, according to the potential at the charge-voltage conversion element 63 from the amplifier transistor 67 via the selection transistor 68 and the vertical signal line 27.

In step S16, the transfer gate element 62 transfers the electric charge accumulated in the photodiode 61 to the charge-voltage conversion element 63 based on the control by the vertical drive section 22.

Specifically, light from a subject that is incident on the photodiode during an exposure period is converted into electric charge in the photodiode 61. When the vertical drive section 22 turns on the transfer gate element 62, the photodiode 61 is electrically connected to the charge-voltage conversion element 63 by the transfer gate element 62, and the electric charge accumulated in the photodiode 61 is transferred to the charge-voltage conversion element 63. After the transfer of the electric charge, the transfer gate element 62 is turned off as necessary, and the charge-voltage conversion element 63 is electrically disconnected from the photodiode 61.

It is to be noted that, under the low-illuminance condition, in order to increase conversion efficiency, the charge-voltage conversion element 63 continues to be electrically disconnected from the charge accumulation elements 65 and 93 after the initialization.

In step S17, the column processing section 23 reads a voltage value, as a signal level, according to the potential at the charge-voltage conversion element 63 from the amplifier transistor 67 via the selection transistor 68 and the vertical signal line 27. The column processing section 23 determines a value of the pixel signal, that is, a pixel value of the pixel, based on the read reset level and the read signal level, and outputs the determined pixel value to the signal processing section 28. After the value of the pixel signal is determined, the image pickup processing on the pixel to be processed is completed.

In the above-described manner, the solid-state image pickup device 11 increases the conversion efficiency through electrically disconnecting the charge-voltage conversion element 63 from the charge accumulation elements 65 and 93 under the low-illuminance condition, thereby increasing sensitivity of the pixel.

Next, image pickup processing under the high-illuminance condition will be described referring to a flow chart shown in FIG. 7. This image pickup processing may be also performed on the respective pixels at the same timing or different timings. Further, at the beginning of the image pickup processing, the transfer gate element 62, the transfer gate element 92, the capacitance switch 64, the reset gate element 66, and the selection transistor 68 are OFF.

Figure 6:
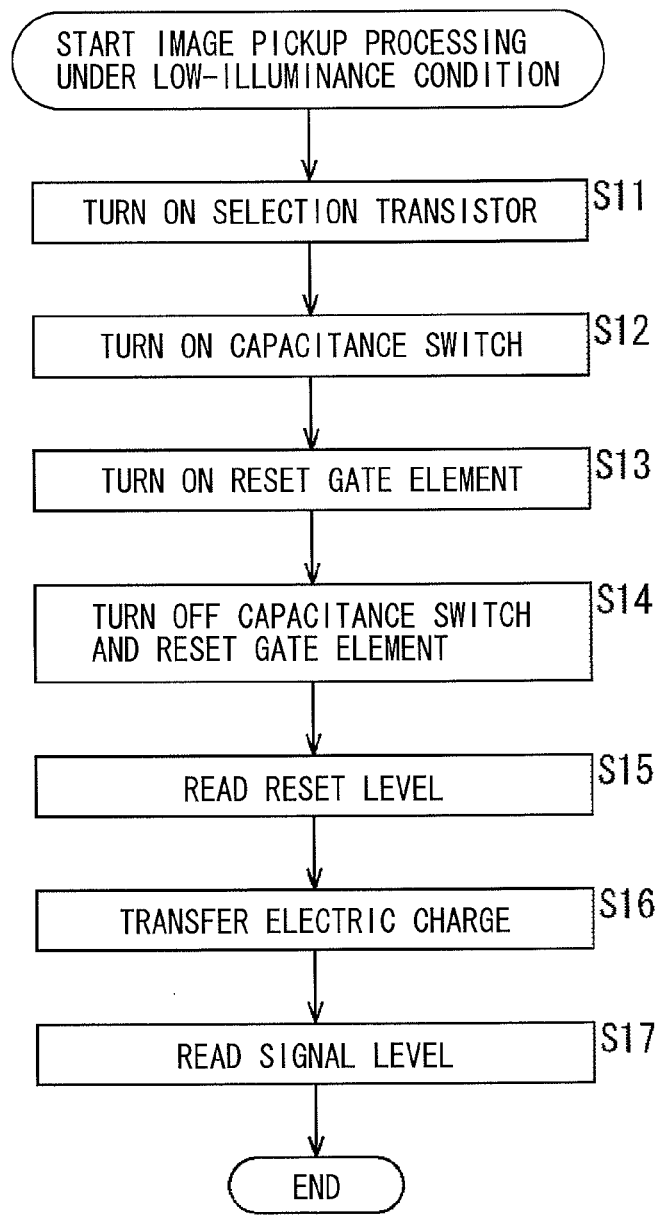
FIG. 6 is a flow chart explaining an image pickup processing under a low-illuminance condition.

It is to be noted that processing in step S41 to step S45 are similar to the processing in step S11 to step S15 in FIG. 6, and therefore, the description thereof will be omitted.

After the processing in step S45 is performed and the reset level is read, the vertical drive section 22 turns on the capacitance switch 64 in step S46.

Accordingly, the charge-voltage conversion element 63 is electrically connected to the charge accumulation elements 65 and 93, and therefore, conversion efficiency is decreased.

After the charge-voltage conversion element 63 is electrically connected to the charge accumulation elements 65 and 93 through the processing in step S46, it proceeds to step S47. The image pickup processing is completed after performing the processing in step S47 and step S48. However, the processing in step S47 and step S48 is similar to the processing in step S16 and step S17 in FIG. 6, and therefore, description thereof will be omitted.

It is to be noted that, in step S47, part of the electric charge transferred from the photodiode 61 to the charge-voltage conversion element 63 is accumulated also in the charge accumulation elements 65 and 93.

In the above-described manner, the solid-state image pickup device 11 decreases the conversion efficiency through electrically connecting the charge-voltage conversion element 63 to the charge accumulation elements 65 and 93 under the high-illuminance condition, thereby decreasing sensitivity of the pixel and increasing the dynamic range of the pixel value.

Figure 7:
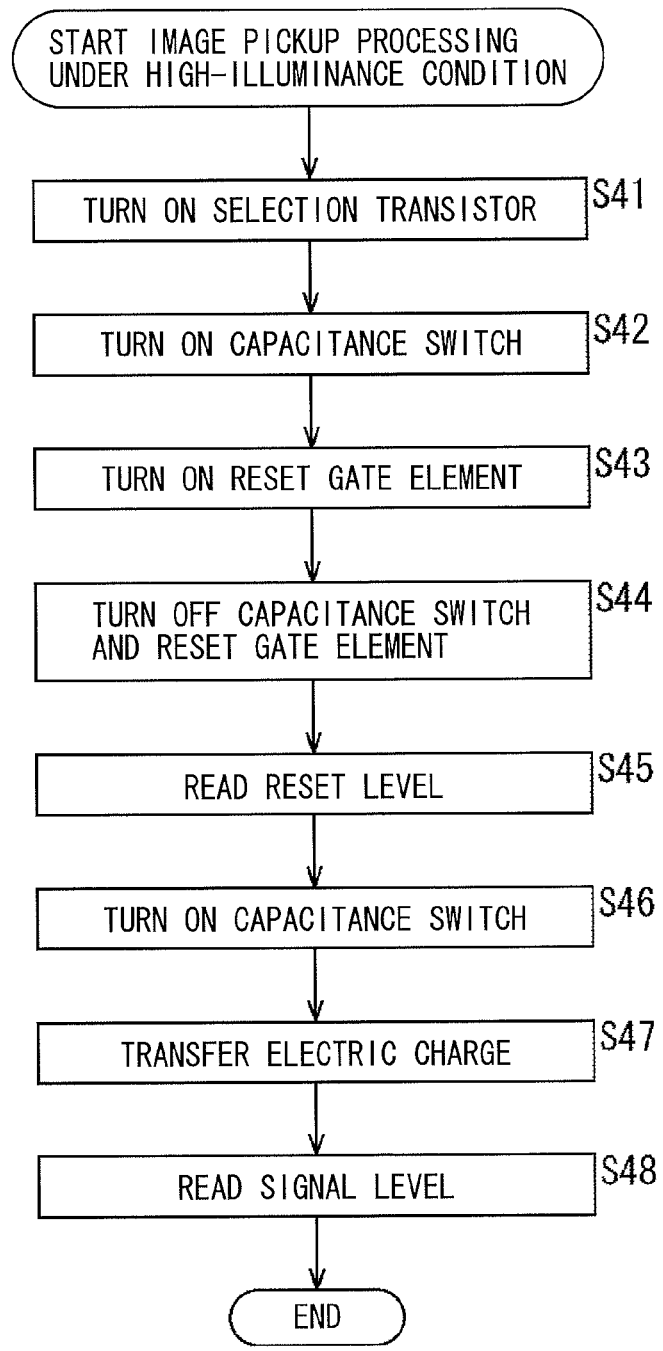
FIG. 7 is a flow chart explaining an image pickup processing under a high-illuminance condition.

It is to be noted that, in the image pickup processing shown in FIG. 7, it is described that the capacitance switch 64 is turned on before transferring the electric charge in photodiode 61 after the initialization of the charge-voltage conversion element 63 and the like. However, the capacitance switch 64 may be turned on after transferring the electric charge in the photodiode 61. In this case, the signal level is read after the capacitance switch 64 is turned on.

Moreover, after the initialization of the charge-voltage conversion element 63 and the like, the capacitance switch 64 may be kept ON without being turned off. In this case, both the reading of the reset level and the reading of the signal level are performed in a state in which the charge-voltage conversion element 63 is electrically connected to the charge accumulation elements 65 and 93.

Second Embodiment

[Configuration Example of Pixel]

The example in which the electrode 94 and the electrode 95 configuring the charge accumulation element 65 are provided in the first metal layer 132 and in the second metal layer 133, respectively, is described above. However, it is to be noted that the electrode configuring the charge accumulation element 65 may be provided between the first metal layer 132 and the photodiode 61.

Figure 8:
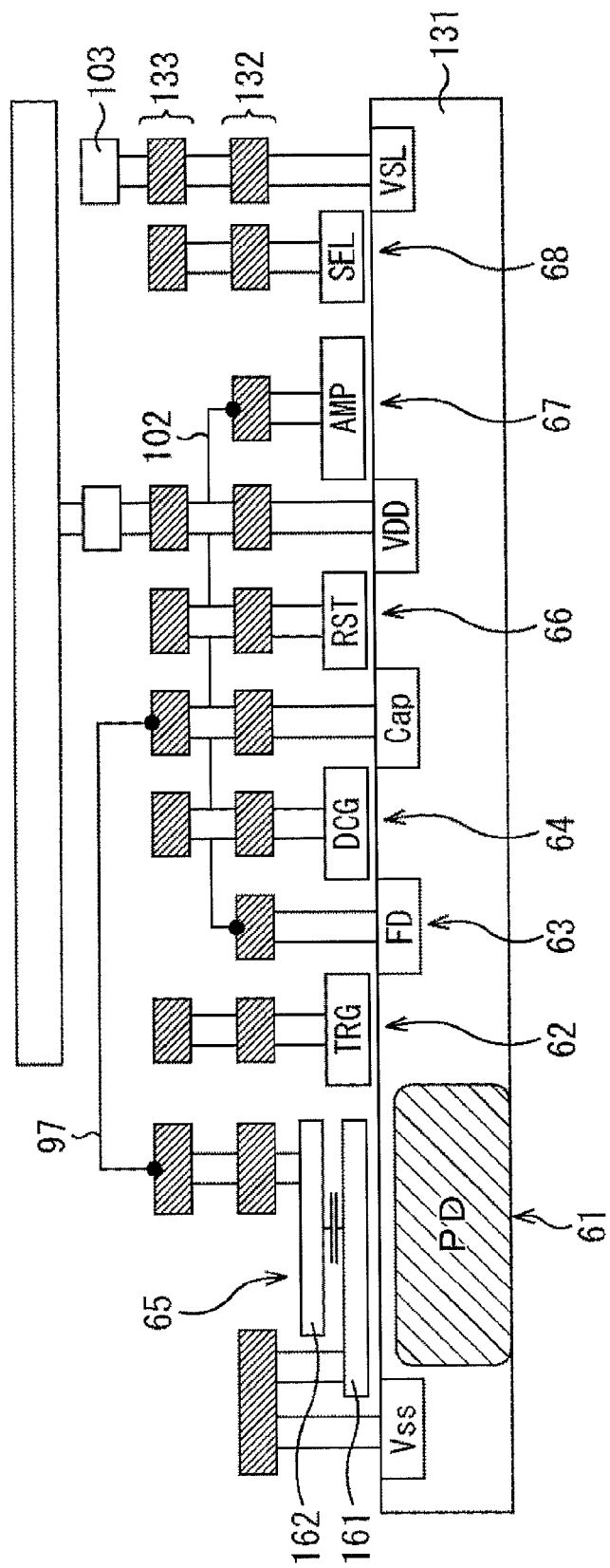
FIG. 8 is a diagram illustrating a cross-section of a pixel.

In such a case, the pixels provided in the solid-state image pickup device 11 may be configured, for example, as shown in FIG. 8. It is to be noted that, in FIG. 8, the same numerals are used to designate corresponding components in FIG. 4, and the description thereof will be appropriately omitted.

In the example shown in FIG. 8, the charge accumulation element 65 includes an electrode 161 and an electrode 162 that face each other. The electrodes 161 and 162 may each be configured, for example, of metal such as aluminum. However, since an interlayer between the electrodes 161 and 162 is thin, a distance between the electrodes 161 and 162 is short. Therefore, higher capacitance of the charge accumulation element 65 is achieved.

Moreover, in this example, the electrode 161 is connected to the unillustrated wire 96 to which the voltage Vss is applied. The voltage Vss may be, for example, at the ground level (GND) or the like. It is to be noted that the electrode 161 may be connected to the power source having the power source voltage VDD. Further, the electrode 162 is connected to the charge-voltage conversion element 63 via the capacitor wire 97 and the capacitance switch 64.

Third Embodiment

[Layout of Charge Accumulation Element]

The example in which the two electrodes configuring the charge accumulation element 65 are formed of metal is described above. However, one of the two electrodes that is arranged on the photodiode 61 side may be formed of polysilicon.

Figure 9:
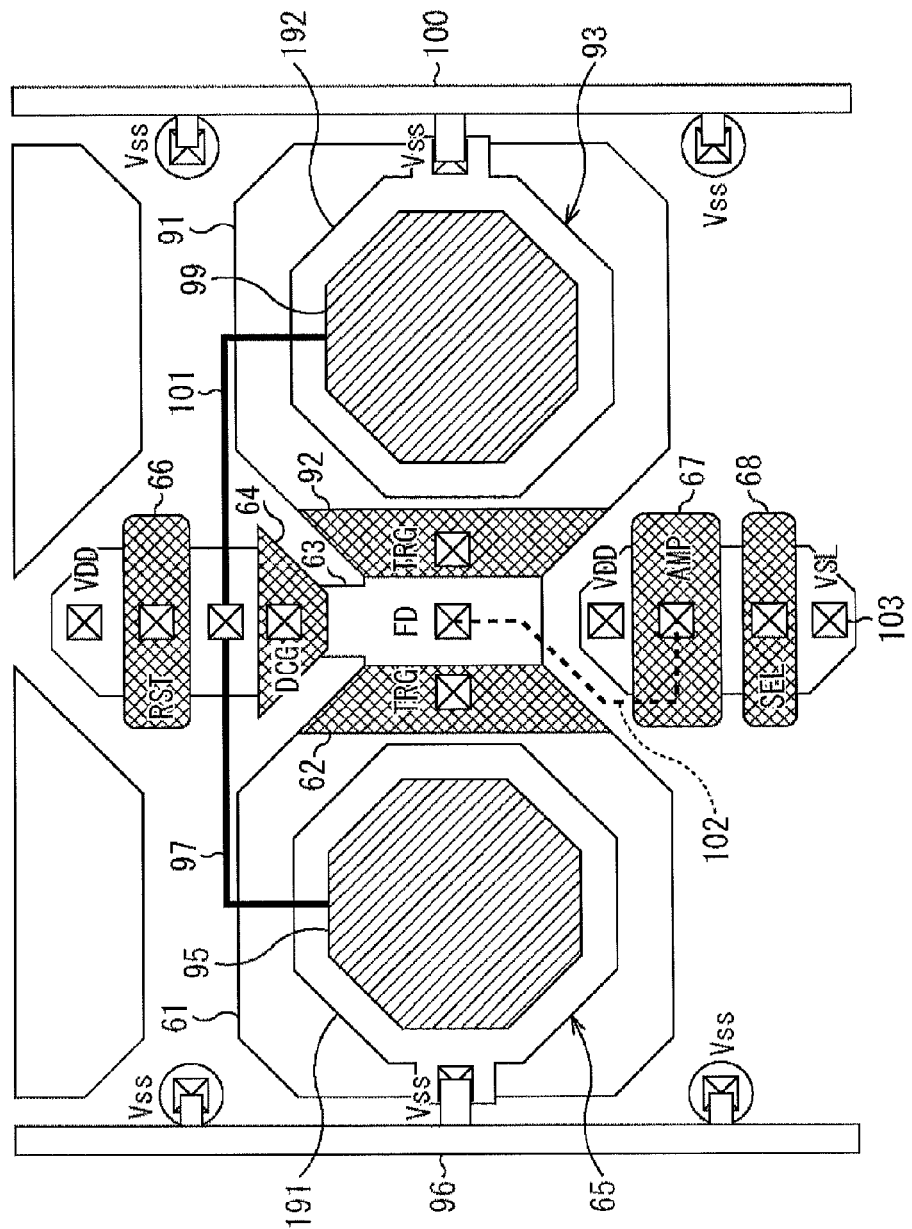
FIG. 9 is a diagram illustrating an arrangement example of the charge accumulation element.

In such a case, the respective elements in the pixel may be arranged, for example, as shown in FIG. 9. It is to be noted that, in FIG. 9, the same numerals are used to designate corresponding components in FIG. 3, and the description thereof will be appropriately omitted.

In the example shown in FIG. 9, the charge accumulation element 65 is provided on an opposite surface of the photodiode 61 from the light receiving surface thereof. The charge accumulation element 65 includes an electrode 191 and the electrode 95 that face each other. For example, the electrode 191 adjacent to the photodiode 61, that is, the electrode 191 arranged between the photodiode 61 and the electrode 95, may be formed of polysilicon. Further, the electrode 95 is formed of metal.

As with the charge accumulation element 65, the charge accumulation element 93 also includes an electrode 192 and the electrode 99 that face each other. The electrode 192 provided on the photodiode 91 side is formed of polysilicon and the electrode 99 is formed of metal.

Moreover, as with the case shown in FIG. 3, the charge accumulation elements 65 and 93 are shared by two pixels and are provided to add capacitance to that of the charge-voltage conversion element 63.

Figure 10:
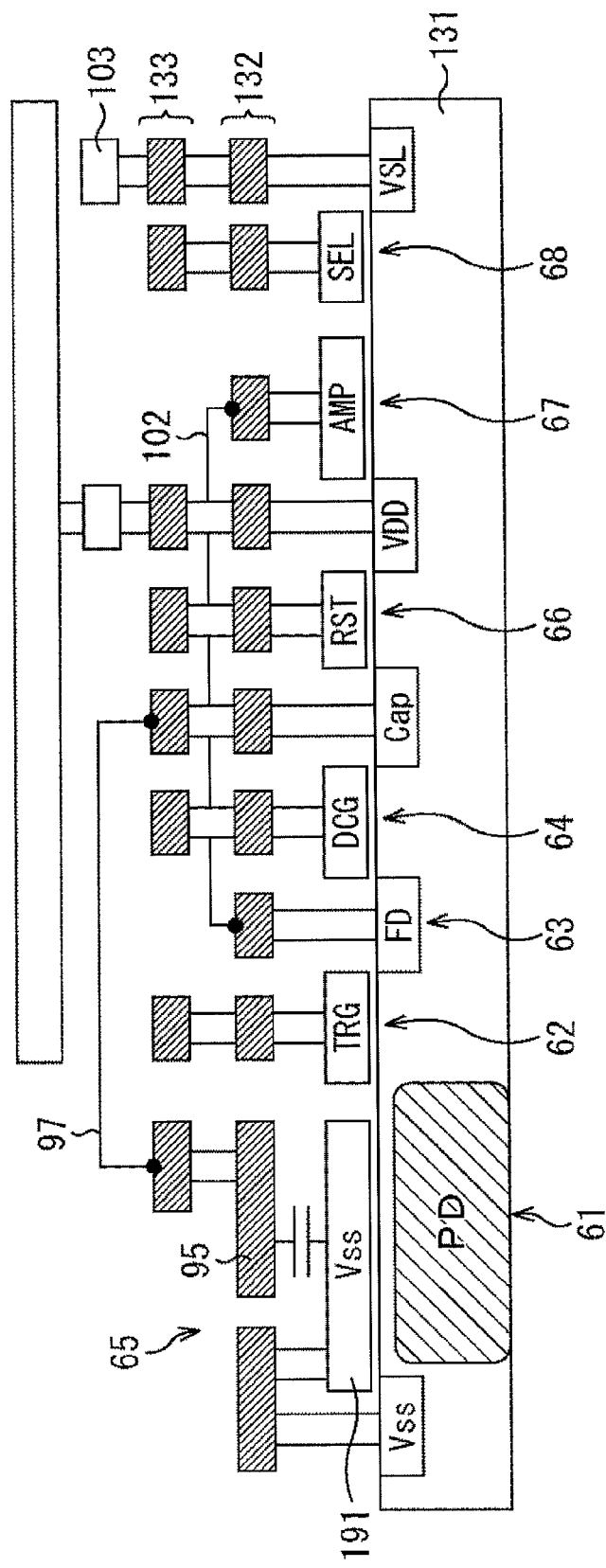
FIG. 10 is a diagram illustrating a cross-section of a pixel.

When the respective elements configuring the pixel have the arrangement shown in FIG. 9, a cross-section of the pixel that includes the photodiode 61 may be, for example, as shown in FIG. 10. It is to be noted that, in FIG. 10, the same numerals are used to designate corresponding components in FIG. 9, and the description thereof will be appropriately omitted.

In FIG. 10, the electrode 95 formed of metal is provided in the first metal layer 132, and the electrode 95 is connected to the charge-voltage conversion element 63 via the capacitor wire 97 and the capacitance switch 64.

The electrode 191 formed of polysilicon is provided between the first metal layer 132 and the photodiode 61, and is adjacent to the photodiode 61. The electrode 191 is connected to the unillustrated wire 96 to which the voltage Vss is applied. For example, the voltage Vss may be, for example, at the ground level or the like. However, the electrode 191 may be connected to the power source having the power source voltage VDD.

Fourth Embodiment

[Configuration Example of Pixel]

When the charge accumulation element 65 includes the electrode 191 and the electrode 95 as shown in FIG. 10 and the photodiode 61 has a so-called HAD (Hole Accumulation Diode) structure, a negative bias may be applied to the photodiode 61.

Figure 11:
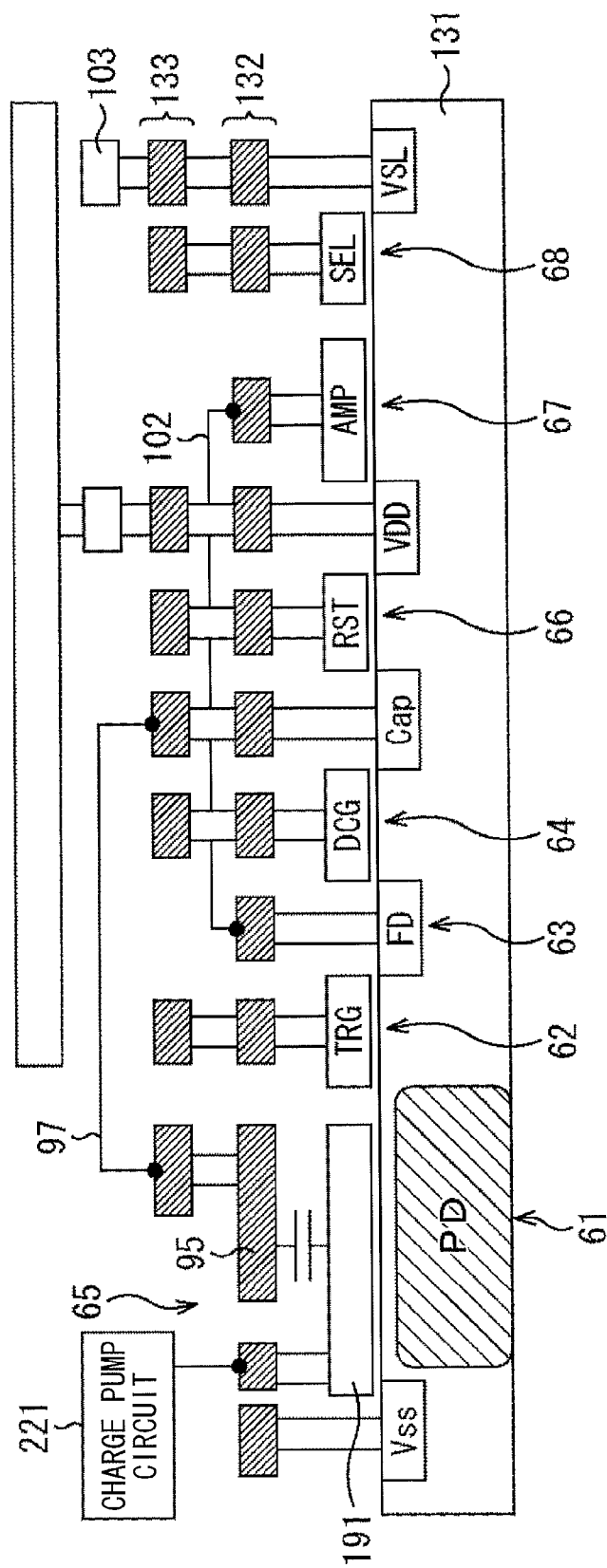
FIG. 11 is a diagram illustrating a cross-section of a pixel.

In such a case, the pixels provided in the solid-state image pickup device 11 may be configured, for example, as shown in FIG. 11. It is to be noted that, in FIG. 11, the same numerals are used to designate corresponding components in FIG. 10, and the description thereof will be appropriately omitted.

In the configuration shown in FIG. 11, a charge pump circuit 221 is further provided in addition to the configuration shown in FIG. 10. The electrode 191 adjacent to the photodiode 61 is connected not to the wire 96 but to the charge pump circuit 221.

"HAD structure" refers to a structure in which an N-type semiconductor region is formed in a P-type semiconductor region, in other words, a structure in which the N-type semiconductor region is sandwiched in the P-type semiconductor regions.

In general, in the photodiode having the HAD structure, it is considered to increase concentration of boron included in the P-type semiconductor region in order to suppress occurrence of dark current, white spot, etc. However, when the concentration of boron is increased, the N-type semiconductor region becomes smaller, which leads to decrease in saturated signal amount. As a result, the dynamic range of the pixel value is decreased.

Therefore, in the pixel in the solid-state image pickup device 11 shown in FIG. 11, the charge pump circuit 221 applies a negative bias to the electrode 191 formed of polysilicon, and thereby, a negative bias is applied to the surface of the photodiode 61.

Through this application of the negative bias, concentration of hole in the surface of the photodiode 61 is increased. Accordingly, a hole accumulation layer is formed in part of the P-type semiconductor region 131 on the surface of the photodiode 61. As a result, the hole in the hole accumulation layer is coupled to noise electron, and therefore, noise caused by the dark current, the white spot, etc. is reduced. Accordingly, an image having higher image quality is obtained. Further, in this case, it is not necessary to increase the concentration of boron in the P-type semiconductor region 131 that configures the photodiode 61. Therefore, the N-type semiconductor region is prevented from being smaller and the saturated signal amount is prevented from being decreased.

Fifth Embodiment

[Configuration Example of Pixel]

It is described above that one or both of the two electrodes configuring the charge accumulation element 65 are formed of metal. However, both of the two electrodes may be formed of polysilicon.

Figure 12:
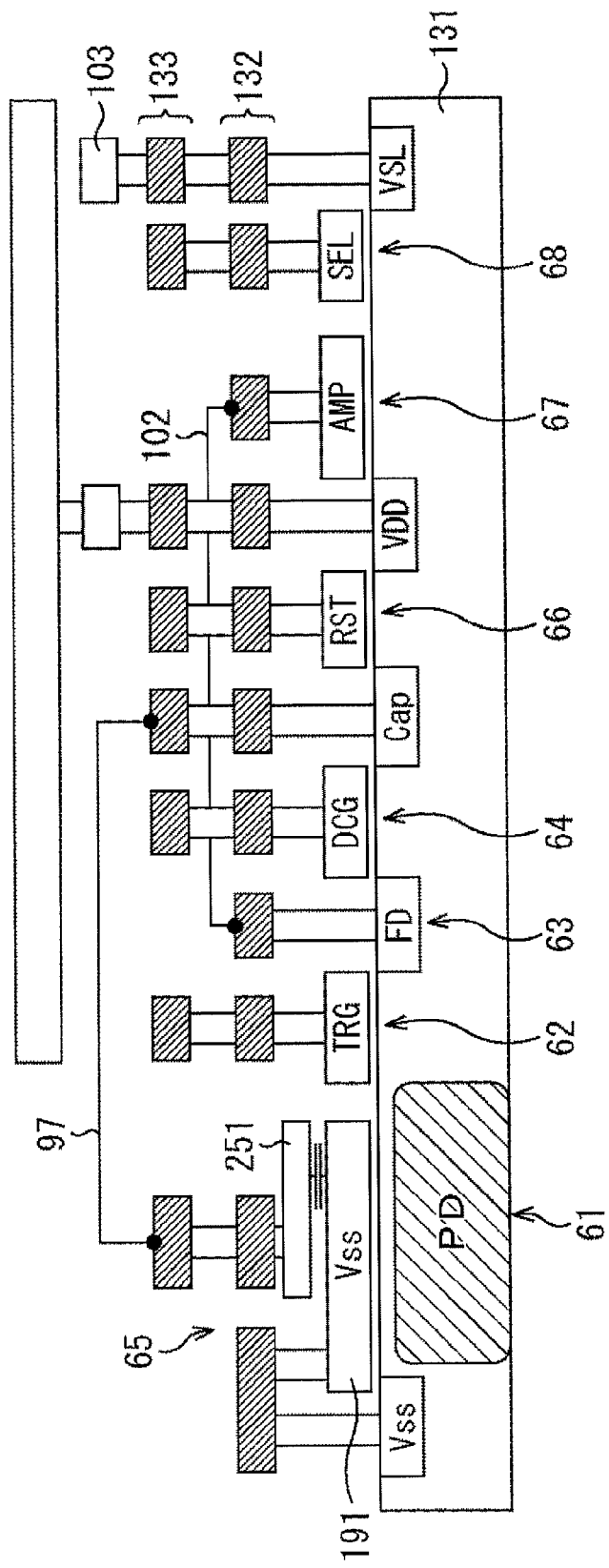
FIG. 12 is a diagram illustrating a cross-section of a pixel.

In such a case, the pixels provided in the solid-state image pickup device 11 may be configured, for example, as shown in FIG. 12. It is to be noted that, in FIG. 12, the same numerals are used to designate corresponding components in FIG. 10, and the description thereof will be appropriately omitted.

In the example shown in FIG. 12, the charge accumulation element 65 includes the electrode 191 and an electrode 251 that face each other. The electrodes 191 and 251 are provided between the photodiode 61 and the first metal layer 132. Further, the electrodes 191 and 251 are each formed of polysilicon.

The electrode 251 is connected to the charge-voltage conversion element 63 via the capacitor wire 97 and the capacitance switch 64. Further, the electrode 191 is connected to the unillustrated wire 96.

Sixth Embodiment

[Configuration Example of Pixel]

Figure 13:
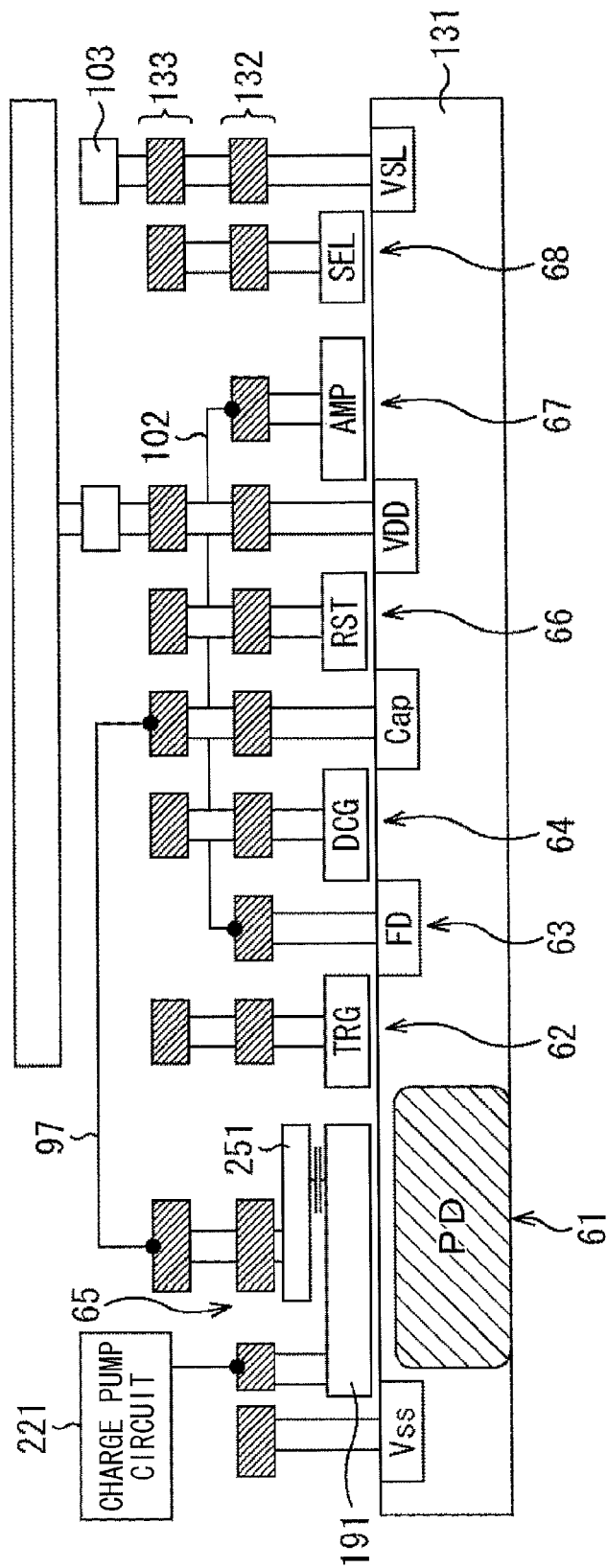
FIG. 13 is a diagram illustrating a cross-section of a pixel.

Moreover, in the configuration shown in FIG. 12, a negative bias may be applied to the electrode 191. In such a case, for example, the pixels in the solid-state image pickup device 11 may be configured as shown in FIG. 13. It is to be noted that, in FIG. 13, the same numerals are used to designate corresponding components in FIG. 11 and FIG. 12, and the description thereof will be appropriately omitted.

In the example shown in FIG. 13, the electrode 191 is connected not to the wire 96 but to the charge pump circuit 221 in the configuration shown in FIG. 12. Therefore, the charge pump circuit 221 applies a negative bias to the electrode 191, and thereby, a negative bias is applied to the surface of the photodiode 61. Accordingly, occurrence of dark current, white spot, etc. is suppressed.

Seventh Embodiment

[Configuration Example of Pixel]

Moreover, when the charge pump circuit 221 applies the negative bias to the electrode 191, higher capacitance may be achieved through reducing the thickness of the interlayer film in the charge accumulation element 65.

Figure 14:
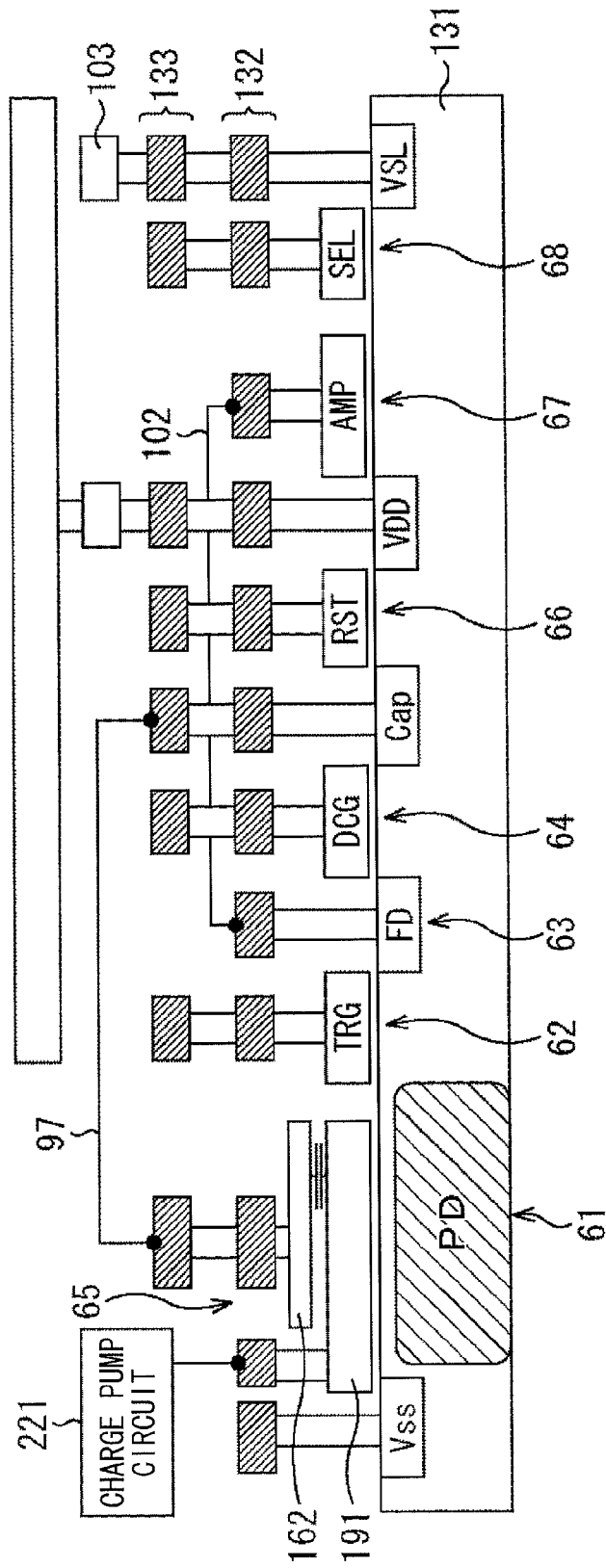
FIG. 14 is a diagram illustrating a cross-section of a pixel.

In such a case, for example, the pixels in the solid-state image pickup device 11 may be configured as shown in FIG. 14. It is to be noted that, in FIG. 14, the same numerals are used to designate corresponding components in FIG. 8 and FIG. 11, and the description thereof will be appropriately omitted.

In the example shown in FIG. 14, the charge accumulation element 65 includes the electrode 191 and the electrode 162 that face each other. The electrode 191 is connected to the charge pump circuit 221 for applying the negative bias. Further, the electrode 191 is formed of polysilicon, and the electrode 162 is formed of metal. Further, the electrode 162 is connected to the charge-voltage conversion element 63 via the capacitor wire 97 and the capacitance switch 64.

A distance between the electrodes 191 and 162 is short since the interlayer film between the electrodes 191 and 162 is thin. The electrodes 191 and 162 are arranged between the photodiode 61 and the first metal layer 132. Accordingly, higher capacitance in the charge accumulation element 65 is achieved.

Eighth Embodiment

[Layout of Charge Accumulation Element]

Figure 15:
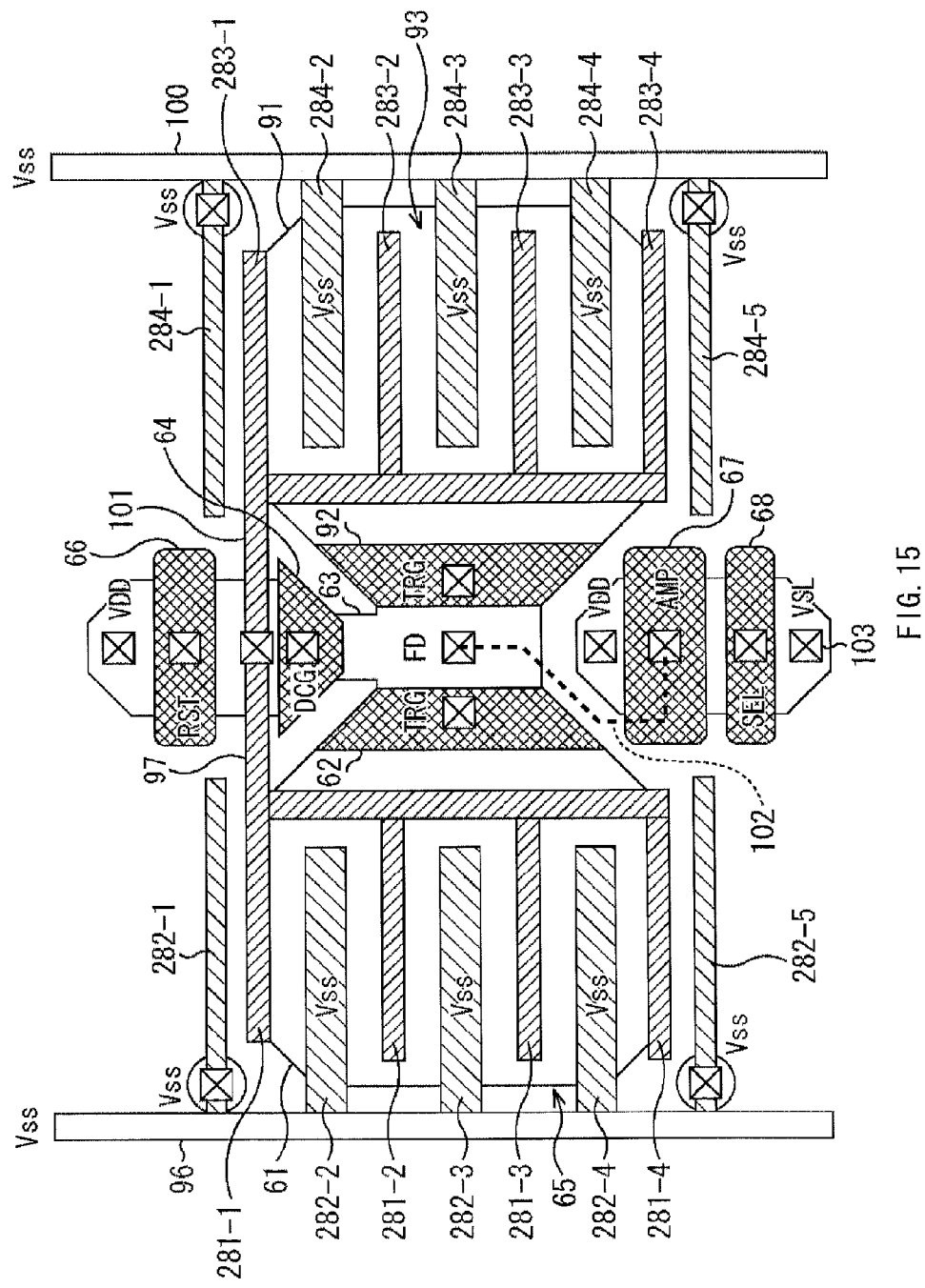
FIG. 15 is a diagram illustrating an arrangement example of the charge accumulation element.

Moreover, in order to increase the capacitance of the charge accumulation element 65 per unit area, the electrodes in the charge accumulation element 65 may be provided in a planer direction or in a vertical direction to form a pectinate shape, and thereby, a configuration that increases facing area may be achieved. In such a case, the respective elements in the pixel may be arranged, for example, as shown in FIG. 15. It is to be noted that, in FIG. 15, the same numerals are used to designate corresponding components in FIG. 3, and the description thereof will be appropriately omitted.

In this example, the charge accumulation element 65 includes electrodes 281-1 to 281-4 and electrodes 282-1 to 282-5. The electrodes 281-1 to 281-4 face the electrodes 282-1 to 282-5. Further, the electrodes 281-1 to 281-4 are each connected to the charge-voltage conversion element 63 via the capacitor wire 97 and the capacitance switch 64. The electrodes 282-1 to 282-5 are each connected to the wire 96 to which the voltage Vss is applied.

It is to be noted that, hereinafter, the respective electrodes 281-1 to 281-4 may be simply referred to as "electrode 281" when it is not particularly necessary to distinguish between the electrodes 281-1 to 281-4. Further, hereinafter, the respective electrodes 282-1 to 282-5 may be simply referred to as "electrode 282" when it is not particularly necessary to distinguish between the electrodes 282-1 to 282-5.

In the charge accumulation element 65, the electrodes 281 and the electrodes 282 are arranged alternately, and the electrode 281 and the electrode 282 that face each other serve as one capacitor. By providing the electrodes 281 and the electrodes 282 in a pectinate shape in such a manner, the capacitance of the charge accumulation element 65 is increased.

Similarly, the charge accumulation element 93 includes electrodes 283-1 to 283-4 and electrodes 284-1 to 284-5. The electrodes 283-1 to 283-4 face the electrodes 284-1 to 284-5. Further, the electrodes 283-1 to 283-4 are each connected to the charge-voltage conversion element 63 via the capacitor wire 101 and the capacitance switch 64. The electrodes 284-1 to 284-5 are each connected to the wire 100 to which the voltage Vss is applied.

It is to be noted that, hereinafter, the respective electrodes 283-1 to 283-4 may be simply referred to as "electrode 283" when it is not particularly necessary to distinguish between the electrodes 283-1 to 283-4. Further, hereinafter, the respective electrodes 284-1 to 284-5 may be simply referred to as "electrode 284" when it is not particularly necessary to distinguish between the electrodes 284-1 to 284-5.

In the charge accumulation element 93, the electrode 283 and the electrode 284 that face each other serve as one capacitor. Further, the charge accumulation element 65 and the charge accumulation element 93 are each shared by two pixels, and are provided to add capacitance to that of the charge-voltage conversion element 63.

Figure 16:
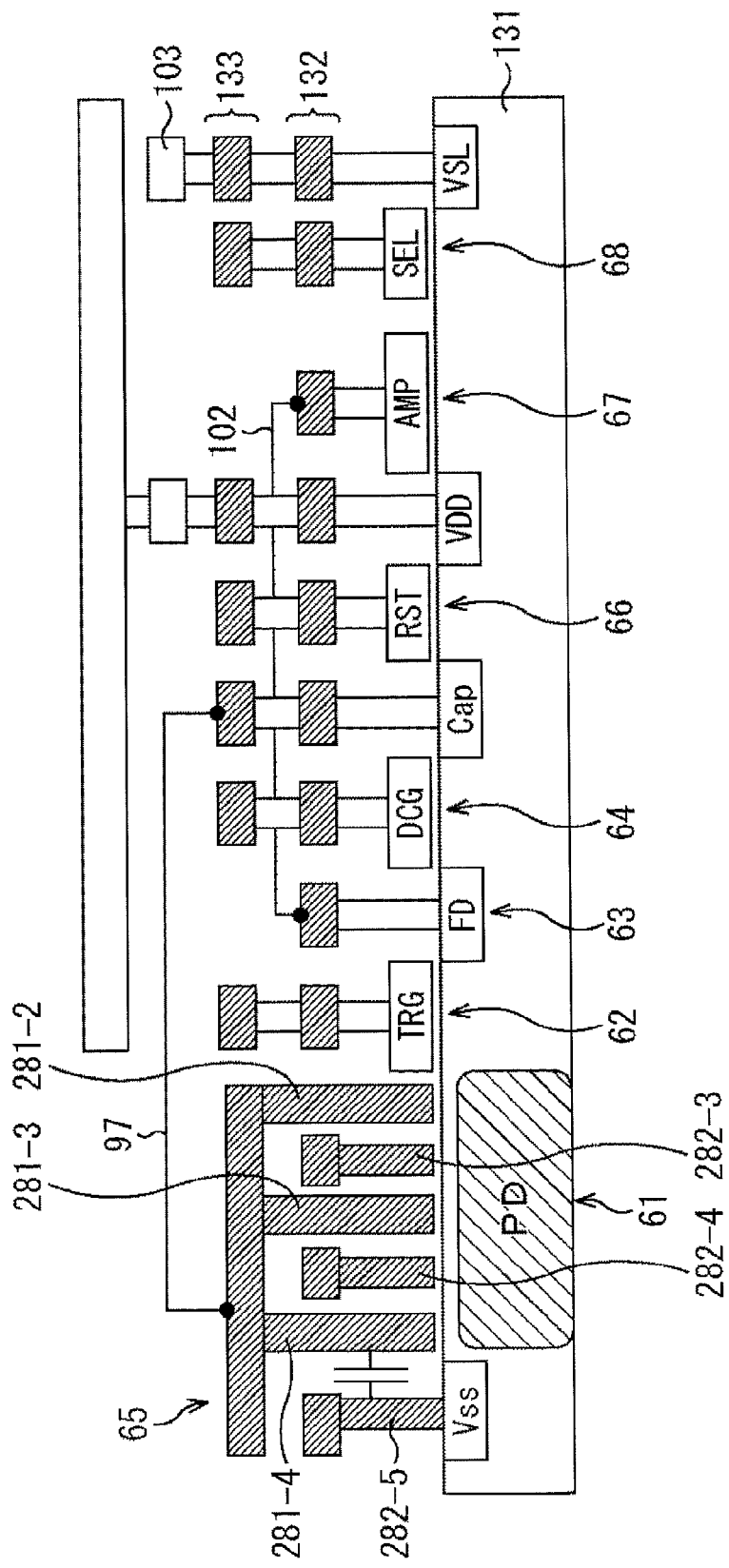
FIG. 16 is a diagram illustrating a cross-section of a pixel.

When the respective elements configuring the pixel are arranged as shown in FIG. 15, a cross-section of the pixel that includes the photodiode 61 may be, for example, as shown in FIG. 16. It is to be noted, in FIG. 16, that the same numerals are used to designate corresponding components in FIG. 15, and the description thereof will be appropriately omitted.

In an example shown in FIG. 16, the electrodes 281 and the electrodes 282 that configure the charge accumulation element 65 are alternately arranged to face one another on a surface on the wiring layer side of the photodiode 61. In particular, the electrodes 281 are each provided in a part that extends from the surface of the photodiode 61 to the second metal layer 133. It is to be noted that, some of the electrodes 281 and 282 are not illustrated in the drawing.

Ninth Embodiment

[Configuration Example of Pixel]

The example in which the embodiment of the present technology is applied to the solid-state image pickup device 11 of a back illumination type is described above. However, the embodiment of the present technology may be applied to an image sensor of a front illumination type. The image sensor of a front illumination type refers to a image sensor that has a configuration in which the wiring layer is provided between the light receiving surface and the photodiode. The wiring layer includes wirings, for example, of a transistor driving each pixel and/or the like. The light receiving surface is a surface on which light from a subject is incident, and is, in other words, an on-chip lens. The photodiode receives light from the subject.

Figure 17:
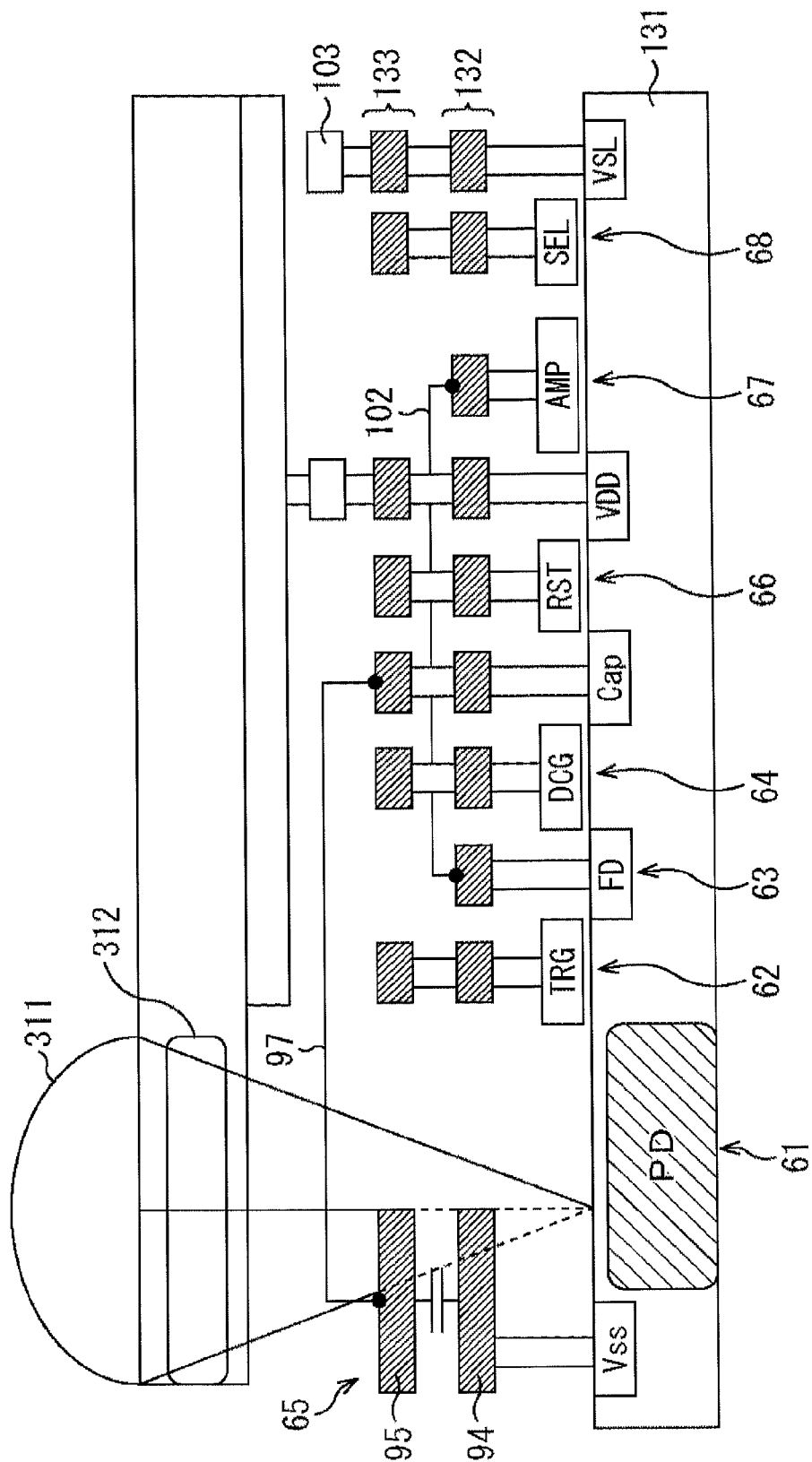
FIG. 17 is a diagram illustrating a cross-section of a pixel.

For example, when the present embodiment of the present technology is applied to the image sensor of a front illumination type, the present embodiment of the present technology may be effectively applied to an image plane phase difference pixel as shown in FIG. 17. It is to be noted that, in FIG. 17, the same numerals are used to designate corresponding components in FIG. 4, and the description thereof will be appropriately omitted.

The image plane phase difference pixel refers to a pixel that is used for image plane phase difference AF (Auto Focus), out of the pixels configuring the solid-state image pickup device. The image plane phase difference AF is a method to adjust focal point by utilizing a phase difference, for example, between an image obtained through receiving light in the image plane phase difference pixel in which right side of the light receiving surface is shielded from light and an image obtained through receiving light in an image plane phase difference pixel in which left side of the light receiving surface is shielded from light.

In an example shown in FIG. 17, the wiring layer that includes the first metal layer 132, the second metal layer 133, and the like is provided on the light receiving surface side of the photodiode 61, that is, in an upper part of the drawing. Further, a lens 311 and a color filter 312 are provided on the upper side of the wiring layer in the drawing.

Accordingly, the light from the subject is collected by the lens 311 and is incident on the color filter 312. Part of the light that passes through the color filter 312 passes through the wiring layer and is incident on the photodiode 61.

In the configuration shown in FIG. 17, the charge accumulation element 65 that includes the two electrodes 94 and 95 formed of metal is arranged between the photodiode 61 and the color filter 312. The charge accumulation element 65 serves as a light shielding layer of the image plane phase difference pixel.

Specifically, the electrodes 94 and 95 are so arranged as to overlap a partial region on the left side, in the drawing, of the charge accumulation region of the photodiode 61. Therefore, part of the light that is collected by the lens 311 and passes through the color filter 312 is shielded by the electrode 95 as shown by a dashed line in the drawings and is prevented from being incident on the photodiode 61.

It is to be noted that the electrode 94 and the electrode 95 are provided in the first metal layer 132 and in the second metal layer 133, respectively. The electrode 94 is connected to a wire to which the voltage Vss is applied. The electrode 95 is connected to the charge-voltage conversion element 63 via the capacitor wire 97 and the capacitance switch 64.

In the above-described manner, the charge accumulation element 65 is so arranged as to overlap a region, in the charge accumulation region of the photodiode 61, on which the light from the subject is prevented from being incident, that is, a region to be shielded from light. Thus, the charge accumulation element 65 is allowed to serve as the light shielding layer of the image plane phase difference pixel. Accordingly, it is not necessary to reduce size of the respective elements, regardless of the area of the charge accumulation element 65.

Accordingly, the area of the photodiode 61 (the area of the photoelectric conversion region) is allowed to be increased, which leads to improvement in light receiving sensitivity of the pixel and saturated signal amount. As a result, S/N ratio of the pixel signal is improved, and thereby, an image having better image quality is obtained.

Moreover, the area of the amplifier transistor 67 is allowed to be increased. Therefore, increase in random noise is suppressed, and thereby, image quality is improved. Further, the areas of the respective transistors such as the transfer gate element 62 are allowed to be increased. Therefore, variations in the transistor characteristics are suppressed. Accordingly, degradation in S/N ratio is suppressed, and an image having better image quality is obtained.

It is to be noted that, also in the configuration shown in FIG. 17, the charge accumulation element provided in another pixel adjacent to the pixel that includes the photodiode 61 may be connected to the capacitance switch 64, and that charge accumulation element may be used, together with the charge accumulation element 65, to add capacitance to that of the charge-voltage conversion element 63. In other words, the charge accumulation element in pixels that are adjacent to each other may be shared by the adjacent pixels as with the case shown in FIG. 3.

Tenth Embodiment

[Configuration Example of Pixel]

Figure 18:
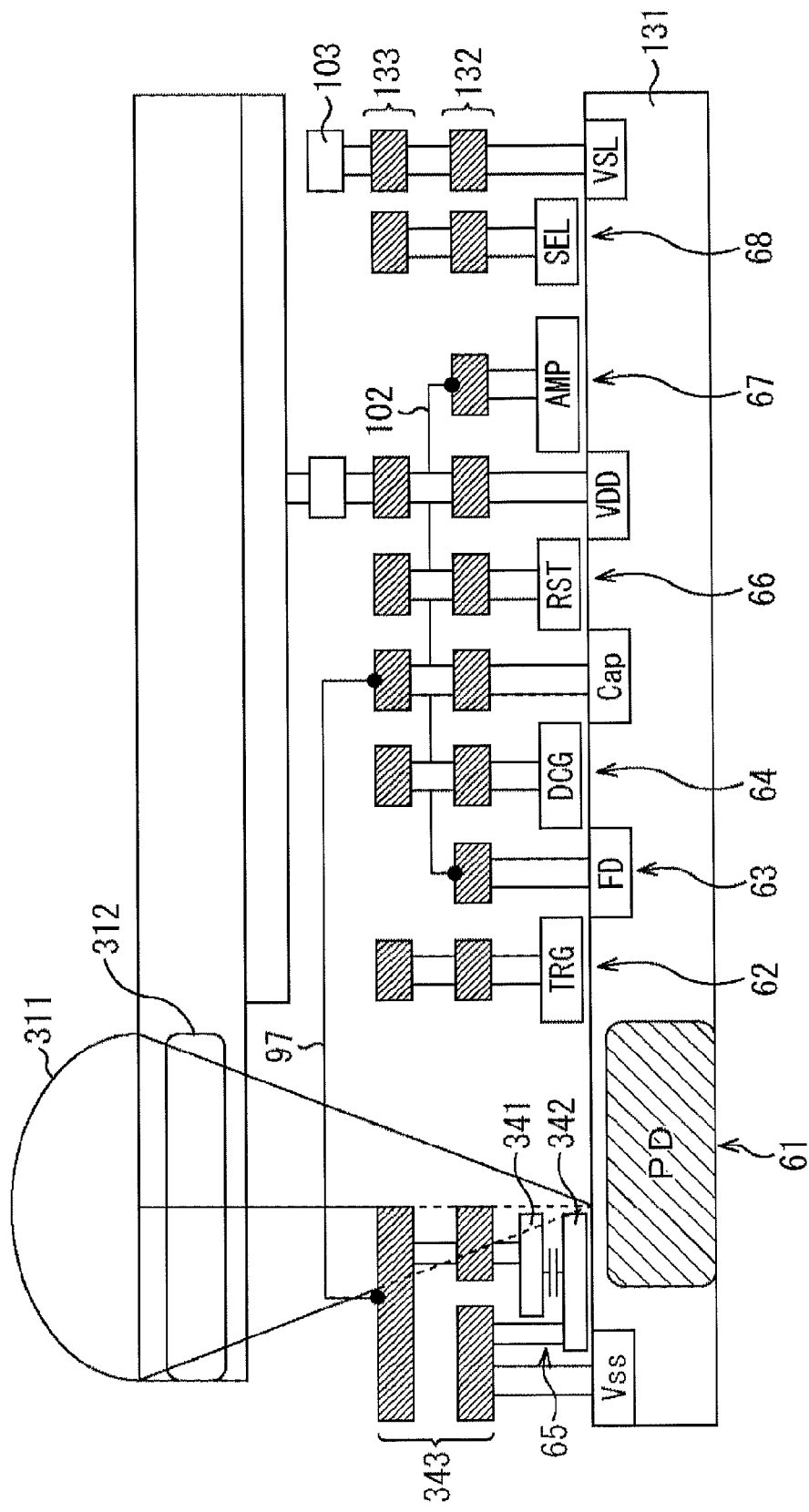
FIG. 18 is a diagram illustrating a cross-section of a pixel.

In FIG. 17, the example in which the charge accumulation element 65 is allowed to serve as a light shielding layer is described. However, the charge accumulation element 65 may be arranged between the light shielding layer and the photodiode 61. In such a case, the image plane phase difference pixel that includes the photodiode 61 may be configured, for example, as shown in FIG. 18. It is to be noted that, in FIG. 18, the same numerals are used to designate corresponding components in FIG. 17, and the description thereof will be appropriately omitted.

In FIG. 18, the charge accumulation element 65 includes an electrode 341 and an electrode 342 that face each other. The electrodes 341 and 342 are arranged between a light shielding layer 343 and the photodiode 61.

In this example, the charge accumulation element 65 does not serve as the light shielding layer. Therefore, the electrodes 341 and 342 are not necessarily formed of metal. Therefore, the electrodes 341 and 342 each may be formed, for example, of metal such as aluminum, copper, gold, and silver, or may be formed, for example, of polysilicon or the like. For example, one of the electrodes 341 and 342 may be formed of metal and the other thereof may be formed of polysilicon.

The light shielding layer 343 is configured of light shielding members each formed of metal. The light shielding members are provided in the first metal layer 132 and the second metal layer 133.

The electrode 341 in the charge accumulation element 65 is connected to the charge-voltage conversion element 63 via the light shielding members forming the light shield layer 343, the capacitor wire 97, and the capacitance switch 64. Further, the electrode 342 in the charge accumulation element 65 is connected, via the light shielding members forming the light shielding layer 343, to a wire to which the voltage Vss is applied. It is to be noted that the light shielding member connected to the electrode 342 is electrically disconnected from the light shielding member connected to the electrode 341.

Also when the charge accumulation element 65 is provided between the light shielding layer 343 and the photodiode 61 as described above, it is not necessary to reduce the size of the respective elements, regardless of the area of the charge accumulation element 65. Therefore, an image having better image quality is obtained.

[Configuration Example of Image Pickup Apparatus]

It is to be noted that the embodiments of the present technology are applicable to general electronic apparatuses that use the solid-state image pickup device in an image reading section (photoelectric conversion element). Examples of such electronic apparatuses may include: image pickup apparatuses such as digital still cameras and video camcorders; portable terminal apparatuses that have an image pickup function; and copy machines that use the solid-state image pickup device in the image reading section. The solid-state image pickup device may be formed as one chip, or may be in a module-like form having an image pickup function in which an image pickup section and a signal processing section are packaged together or in which an image pickup section and an optical system are packaged together.

Figure 19:
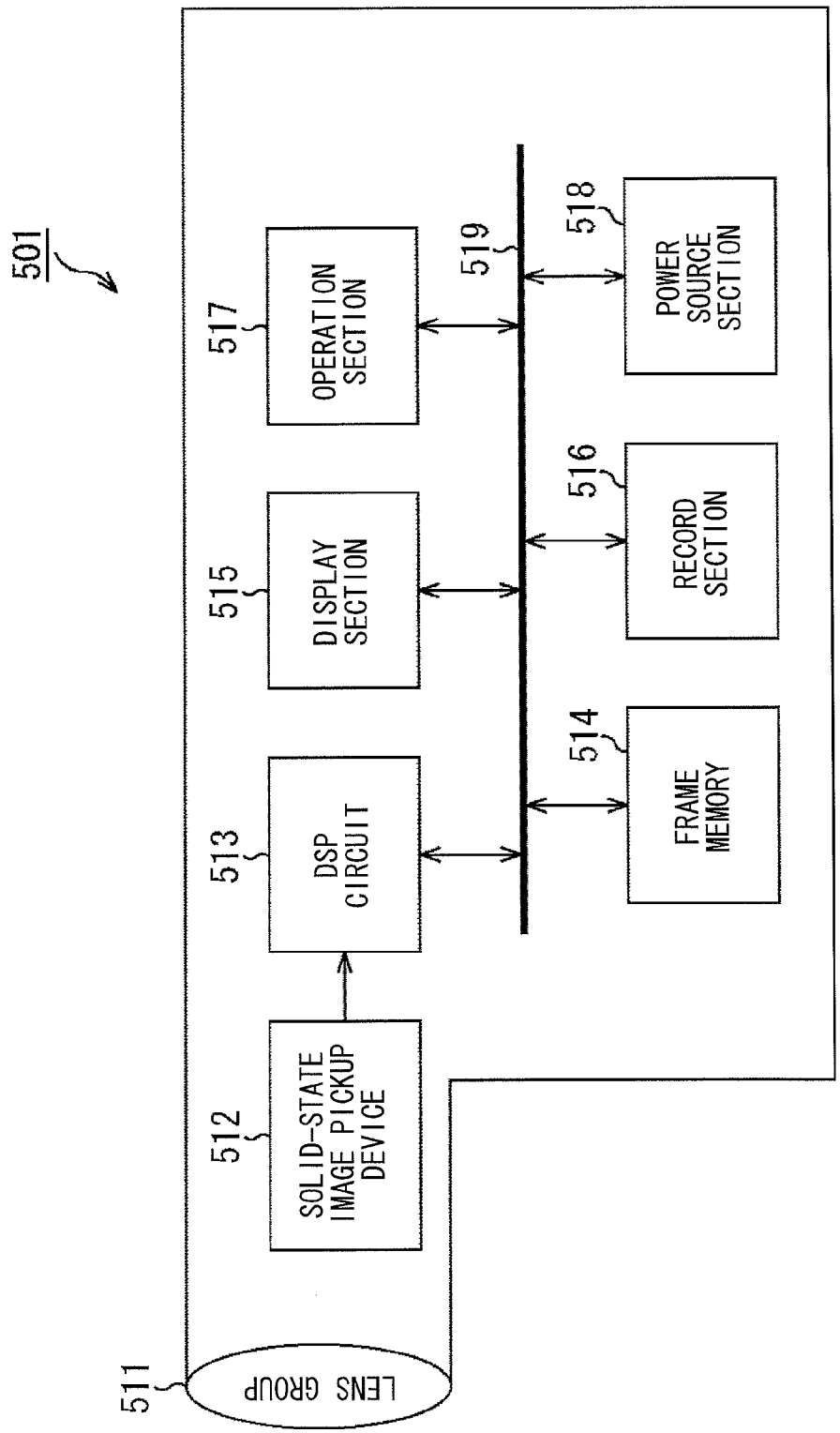
FIG. 19 is a diagram illustrating a configuration example of an image pickup apparatus.

FIG. 19 is a diagram illustrating a configuration example of an image pickup apparatus as an electronic apparatus to which the above-described embodiments of the present technology is applied.

An image pickup apparatus 501 shown in FIG. 19 includes an optical section 511 including lens groups etc., a solid-state image pickup device (image pickup device) 512, and a DSP (Digital Signal Processor) circuit 513 that is a camera signal processing circuit. Further, the image pickup apparatus 501 also includes a frame memory 514, a display section 515, a record section 516, an operation section 517, and a power source section 518. The DSP circuit 513, the frame memory 514, the display section 515, the record section 516, the operation section 517, and the power source section 518 are connected to one another via a bus line 519.

The optical section 511 takes in incident light (image light) from a subject and forms an image on an image pickup plane of the solid-state image pickup device 512. The solid-state image pickup device 512 converts, into an electric signal, an amount of incident light that is used to form the image on the image pickup plane in a pixel unit, and outputs the electric signal as a pixel signal. The solid-state image pickup device 512 corresponds to the above-described solid-state image pickup device 11.

The display section 515 may be formed, for example, of a panel-type display such as a liquid crystal panel and an organic EL (Electro Luminescence) panel. The display section 515 displays moving image or a still image that has been picked up by the solid-state image pickup device 512. The record section 516 records the moving image or the still image that has been picked up by the solid-state image pickup device 512 in a recording media such as a video tape and a DVD (Digital Versatile Disk).

The operation section 517 gives, based on operation by a user, operation instructions related to various functions of the image pickup apparatus 501. The power source section 518 appropriately supplies various power sources that serve as operation power sources of the DSP circuit 513, the frame memory 514, the display section 515, the record section 516, and the operation section 517 to these targets.

The above embodiments are described referring to the case as an example in which the embodiments are applied to a CMOS image sensor in which pixels that detect signal electric charge according to an amount of visible light as a physical amount are arranged in rows and columns. However, the present technology is not limited to CMOS image sensors but is applicable to other types of solid-image pickup devices.

The above-described embodiments of the present technology are not limited to the image pickup device that detects distribution of an amount of incident visible light and picks up the distribution as an image. The above-described embodiments of the present technology are applicable to a solid-state image pickup device that picks up distribution of incident amount of infrared ray, X-ray, particles, etc. as an image.

Moreover, the embodiments of the present technology are not limited to the above-described embodiments and may be variously modified without departing from the scope of the gist of the present technology.

It is possible to achieve at least the following configurations from the above-described example embodiments and the modifications of the disclosure.

(1) A solid-state image pickup device including:

a photoelectric conversion element including a charge accumulation region, the photoelectric conversion element performing photoelectric conversion on incident light and accumulating, in the charge accumulation region, electric charge obtained through the photoelectric conversion;

a charge-voltage conversion element accumulating the electric charge obtained through the photoelectric conversion; and a charge accumulation element adjacent to the photoelectric conversion element, part or all of the charge accumulation element overlapping the charge accumulation region, and the charge accumulation element adding capacitance to capacitance of the charge-voltage conversion element.

(2) The solid-state image pickup device according to (1), wherein, the charge accumulation element is provided in each pixel that includes the photoelectric conversion element, and the charge accumulation element provided in a predetermined pixel and the charge accumulation element provided in another pixel adjacent to the predetermined pixel add capacitance to the capacitance of the charge-voltage conversion element, when the electric charge is accumulated in the charge-voltage conversion element in the predetermined pixel.

(3) The solid-state image pickup device according to (1) or (2), further including a switch performing switching between a state in which the charge-voltage conversion element is electrically connected to the charge accumulation element and a state in which the charge-voltage conversion element is electrically disconnected from the charge accumulation element.

(4) The solid-state image pickup device according to any one of (1) to (3), wherein the solid-state image pickup device is of a back illumination type, and the charge accumulation element is adjacent to an opposite surface of the photoelectric conversion element from a light incident surface of the photoelectric conversion element.

(5) The solid-state image pickup device according to (4), wherein the charge accumulation element includes electrodes facing each other, and one of the electrodes that is provided closer to the photoelectric conversion element is formed of metal.

(6) The solid-state image pickup device according to any one of (1) to (3), wherein the solid-state image pickup device includes an image plane phase difference pixel, and the charge accumulation element is adjacent to a light incident surface of the photoelectric conversion element, and serves as a light shielding layer of the image plane phase difference pixel.

(7) The solid-state image pickup device according to any one of (1) to (3), wherein the solid-state image pickup device includes an image plane phase difference pixel, and the charge accumulation element is provided between the photoelectric conversion element and a light shielding layer of the image plane phase difference pixel, the light shielding layer shielding part of the light incident on the photoelectric conversion element.

(8) The solid-state image pickup device according to any one of (1) to (7), wherein the charge accumulation element includes a first group including a plurality of electrodes and a second group including a plurality of electrodes, the first group facing the second group, and each of the first and second groups including the plurality of electrodes being arranged in a pectinate shape.

(9) The solid-state image pickup device according to any one of (1) to (8), further including a negative bias application section applying a negative bias to the photoelectric conversion element via the charge accumulation element.

(10) The solid-state image pickup device according to any one of (1) to (9), wherein the charge accumulation element includes electrodes facing each other, one of the electrodes being formed of one of metal and polysilicon, and the other of the electrodes being formed of one of the metal and the polysilicon.

(11) A method of driving a solid-state image pickup device with a photoelectric conversion element including a charge accumulation region, the photoelectric conversion element performing photoelectric conversion on incident light and accumulating, in the charge accumulation region, electric charge obtained through the photoelectric conversion, a charge-voltage conversion element accumulating the electric charge obtained through the photoelectric conversion, and a charge accumulation element adjacent to the photoelectric conversion element, part or all of the charge accumulation element overlapping the charge accumulation region, and the charge accumulation element adding capacitance to capacitance of the charge-voltage conversion element, the method including:

allowing the photoelectric conversion element to convert the light incident from a subject into the electric charge through the photoelectric conversion; and allowing the charge-voltage conversion element to accumulate the electric charge obtained in the photoelectric conversion element.

[1] An image sensor, comprising:
a semiconductor substrate, including:
  a photoelectric conversion element;
  a charge-voltage conversion element;
a capacitance switch;
a charge accumulation element adjacent the photoelectric conversion element, wherein at least a portion of the charge accumulation element overlaps a charge accumulation region of the photoelectric conversion element, wherein the charge accumulation element is selectively connected to the charge-voltage conversion element by the capacitance switch.

[2] The image sensor of [1], wherein a capacitance of the charge accumulation element is added to a capacitance of the charge-voltage conversion element when the capacitance switch is closed.

[3] The image sensor of [1] or [2], wherein the photoelectric conversion element is provided between the charge accumulation element and a light receiving surface of the semiconductor substrate.

[4] The image sensor of any one of [1] to [3], further comprising:
a wiring layer, wherein the image sensor is a back illumination type image sensor in which the photoelectric conversion element is provided between a light receiving surface of the semiconductor substrate and the wiring layer.

[5] The image sensor of [4], wherein the charge accumulation element is part of the wiring layer.

[6] The image sensor of any one of [1] to [5], further comprising:
a light shielding layer.

[7] The image sensor of [6], wherein the charge accumulation element is formed as part of the light shielding layer.

[8] The image sensor of [6] or [7], wherein the charge accumulation element is formed between the light shielding layer and the photoelectric conversion element.

[9] The image sensor of any one of [1] to [8], wherein a plurality of photoelectric conversion elements and a plurality of charge-voltage conversion elements share a single one of the charge accumulation elements.

[10] The image sensor of any one of [1] to [9], wherein the charge accumulation element includes first and second electrodes, wherein a first one of the electrodes is connected to the capacitance switch.

[11] The image sensor of any one of [1] to [10], wherein the charge-voltage conversion element is a floating diffusion region, and wherein the charge accumulation element is a capacitor.

[12] The image sensor of any one of [1] to [11], wherein the image sensor is a front illumination type image sensor, wherein the charge-voltage conversion element is included in an image plane phase difference pixel, and wherein the charge accumulation element operates as a light shielding layer with respect to the charge-voltage conversion element.

[13] An imaging apparatus, comprising:
an optical section;
a solid-state image pickup device operable to receive light from the optical section, including:
a photoelectric conversion element;
a charge-voltage conversion element;
a capacitance switch;
a charge accumulation element adjacent the photoelectric conversion element, wherein at least a portion of the charge accumulation element overlaps a charge accumulation region of the photoelectric conversion element, and wherein the charge accumulation element can be selectively connected to the charge-voltage conversion element by the capacitance switch; and
a digital signal processor, wherein the digital signal processor receives a signal from the solid-state image pickup device.

[14] The apparatus of [13], wherein the photoelectric conversion element is provided between the charge accumulation element and a light receiving surface of a semiconductor substrate in which the photoelectric conversion elements are formed.

[15] The apparatus of [14], further comprising:
a wiring layer, wherein the image sensor is a back illumination type image sensor in which the photoelectric conversion element is provided between a light receiving surface of the semiconductor substrate and the wiring layer.

[16] The apparatus of [15], wherein the charge accumulation element is part of the wiring layer.

[17] The apparatus of any one of [13] to [16], further comprising:
a light shielding layer.

[18] The apparatus of [17], wherein the charge accumulation element is formed between the light shielding layer and the photoelectric conversion element.

[19] A method of driving an image sensor, comprising:
providing a solid-state image sensor, including:
a photoelectric conversion element;
a charge-voltage conversion element;
a charge accumulation element adjacent the photoelectric conversion element, wherein at least a portion of the charge accumulation element overlaps a charge accumulation region of the photoelectric conversion element, and wherein a capacitance of the charge accumulation element is capable of being added to a capacitance of the charge-voltage conversion element;
detecting an illuminance condition;
in response to determining that the illuminance condition is low, electrically disconnecting the charge-voltage conversion element from the charge accumulation element;
in response to determining that the illuminance condition is high, electrically connecting the charge-voltage conversion element to the charge accumulation element.

[20] The method of [19], further comprising:
providing a capacitance switch, wherein the charge accumulation element is selectively connected to the charge-voltage conversion element by the capacitance switch.

[21] The method of [20], further comprising:
opening the capacitance switch to electrically disconnect the charge-voltage conversion element from the charge accumulation element.

[22] The method of [20] or [21], further comprising:
closing the capacitance switch to electrically connect the charge-voltage conversion element to the charge accumulation element.

[23] The method of any one of [19] to [22], wherein the solid-state image sensor is a back illumination type image sensor.

[24] The method of any one of [19] to [23], wherein the solid-state image sensor is a front illumination type sensor and includes an image plane phase difference pixel, the method further comprising:
using the image plane phase difference pixel for image plane phase difference auto focus, wherein the charge accumulation element operates as a light shielding layer of the image plane phase difference pixel.

The present application contains subject matter related to that disclosed in Japanese Priority Patent Application JP 2012-266002 filed in the Japan Patent Office on Dec. 5, 2012 the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. An image sensor, comprising:
a semiconductor substrate, including:
a plurality of photoelectric conversion elements, including at least a first photoelectric conversion element and a second photoelectric conversion element;
a charge-voltage conversion element, wherein the charge-voltage conversion element is shared by the first and second photoelectric conversion elements;
a capacitance switch, wherein the capacitance switch is shared by the first and second photoelectric conversion elements;
a first charge accumulation element adjacent the first photoelectric conversion element, wherein at least a portion of the first charge accumulation element overlaps a charge accumulation region of the first photoelectric conversion element;
a second charge accumulation element adjacent the second photoelectric conversion element, wherein at least a portion of the second charge accumulation element overlaps a charge accumulation region of the second photoelectric conversion element, wherein the first and second charge accumulation elements are selectively connected to the charge-voltage conversion element by the capacitance switch.

2. The image sensor of claim 1, wherein a capacitance of the first and second charge accumulation elements are added to a capacitance of the charge-voltage conversion element when the capacitance switch is closed.

3. The image sensor of claim 1, wherein the first photoelectric conversion element is provided between the first charge accumulation element and a light receiving surface of the semiconductor substrate, and wherein the second photoelectric conversion element is provided between the second charge accumulation element and the light receiving surface of the semiconductor substrate.

4. The image sensor of claim 1, further comprising:
a wiring layer, wherein the image sensor is a back illumination type image sensor in which the first and second photoelectric conversion elements are provided between a light receiving surface of the semiconductor substrate and the wiring layer.

5. The image sensor of claim 4, wherein the first and second charge accumulation elements are part of the wiring layer.

6. The image sensor of claim 1, further comprising:
a light shielding layer.

7. The image sensor of claim 6, wherein the first and second charge accumulation elements are formed as part of the light shielding layer.

8. The image sensor of claim 6, wherein the first charge accumulation element is formed between the light shielding layer and the first photoelectric conversion element, and wherein the second charge accumulation element is formed between the light shielding layer and the second photoelectric conversion element.

9. The image sensor of claim 1, wherein each of the first and second charge accumulation elements includes first and second electrodes, wherein a first one of the electrodes is connected to the capacitance switch.

10. The image sensor of claim 1, wherein the charge-voltage conversion element is a floating diffusion region, and wherein each of the first and second charge accumulation elements is a capacitor.

11. The image sensor of claim 1, wherein the image sensor is a front illumination type image sensor, wherein the first photoelectric conversion element is included in an image plane phase difference pixel, and wherein the first charge accumulation element operates as a light shielding layer with respect to the first photoelectric conversion element.

12. An imaging apparatus, comprising:
an optical section;
a solid-state image pickup device operable to receive light from the optical section, including:
a plurality of photoelectric conversion elements, including at least a first photoelectric conversion element and a second photoelectric conversion element;
a charge-voltage conversion element, where the charge-voltage conversion element is shared by the first and second photoelectric conversion elements;
a capacitance switch, wherein the capacitance switch is shared by the first and second photoelectric conversion elements;
a first charge accumulation element adjacent the first photoelectric conversion element, wherein at least a portion of the first charge accumulation element overlaps a charge accumulation region of the first photoelectric conversion element;
a second charge accumulation element adjacent the second photoelectric conversion element, wherein at least a portion of the second charge accumulation element overlaps a charge accumulation region of the second photoelectric conversion element, and wherein the first and second charge accumulation elements can be selectively connected to the charge-voltage conversion element by the capacitance switch; and
a digital signal processor, wherein the digital signal processor receives a signal from the solid-state image pickup device.

13. The apparatus of claim 12, wherein the first photoelectric conversion element is provided between the first charge accumulation element and a light receiving surface of a semiconductor substrate in which the photoelectric conversion elements are formed, and wherein the second photoelectric conversion element is provided between the second charge accumulation element and the light receiving surface of the semiconductor substrate in which the photoelectric conversion elements are formed.

14. The apparatus of claim 13, further comprising:
a wiring layer, wherein the image sensor is a back illumination type image sensor in which the photoelectric conversion elements are provided between a light receiving surface of the semiconductor substrate and the wiring layer.

15. The apparatus of claim 14, wherein the charge accumulation elements are part of the wiring layer.

16. The apparatus of claim 12, further comprising:
a light shielding layer.

17. The apparatus of claim 16, wherein the charge accumulation elements are formed between the light shielding layer and the first and second photoelectric conversion elements respectively.

18. A method of driving an image sensor, comprising:
providing a solid-state image sensor, including:
a plurality of photoelectric conversion elements, including at least a first photoelectric conversion element and a second photoelectric conversion element;
a charge-voltage conversion element, wherein the charge-voltage conversion element is shared by the first and second photoelectric conversion elements;
a first charge accumulation element adjacent the first photoelectric conversion element, wherein at least a portion of the first charge accumulation element overlaps a charge accumulation region of the first photoelectric conversion element;
a second charge accumulation element adjacent the second photoelectric conversion element, wherein at least a portion of the second charge accumulation element overlaps a charge accumulation region of the second photoelectric conversion element, and wherein a capacitance of both of the first and second charge accumulation elements is capable of being added to a capacitance of the charge-voltage conversion element;
detecting an illuminance condition;
in response to determining that the illuminance condition is low, electrically disconnecting the charge-voltage conversion element from the first and second charge accumulation elements by opening a capacitance switch;
in response to determining that the illuminance condition is high, electrically connecting the charge-voltage conversion element to the first and second charge accumulation elements by closing the capacitance switch.

19. The method of claim 18, wherein the first and second charge accumulation elements are selectively connected to the charge-voltage conversion element by the capacitance switch.

20. The method of claim 19, further comprising:
opening the capacitance switch to electrically disconnect the charge-voltage conversion element from the first and second charge accumulation elements.

21. The method of claim 19, further comprising:
closing the capacitance switch to electrically connect the charge-voltage conversion element to the first and second charge accumulation elements.

22. The method of claim 18, wherein the solid-state image sensor is a back illumination type image sensor.

23. The method of claim 18, wherein the solid-state image sensor is a front illumination type sensor and includes an image plane phase difference pixel, the method further comprising:
using the image plane phase difference pixel for image plane phase difference auto focus, wherein the first charge accumulation element operates as a light shielding layer of the image plane phase difference pixel.

* * * * *